(12) United States Patent
Kitaoka et al.

(10) Patent No.: US 6,261,858 B1
(45) Date of Patent: Jul. 17, 2001

(54) WAVELENGTH-VARIABLE SEMICONDUCTOR LASER, OPTICAL INTEGRATED DEVICE UTILIZING THE SAME, AND PRODUCTION METHOD THEREOF

(75) Inventors: Yasuo Kitaoka, Ibaraki; Kiminori Mizuuchi, Neyagawa; Kazuhisa Yamamoto, Takatsuki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/616,545

(22) Filed: Jul. 14, 2000

Related U.S. Application Data

(62) Division of application No. 09/146,024, filed on Sep. 2, 1998.

(30) Foreign Application Priority Data

Sep. 2, 1997 (JP) .................................. 9-237378
Feb. 9, 1998 (JP) .................................. 10-26942

(51) Int. Cl.[7] .................................. H01L 21/301
(52) U.S. Cl. .................... 438/31; 438/33; 438/462; 438/25
(58) Field of Search .................. 438/22, 23, 24, 438/25, 26, 29, 31, 32, 33, 460, 462, 113, 106; 385/88, 14; 372/50

(56) References Cited

U.S. PATENT DOCUMENTS

| | | | |
|---|---|---|---|
| 4,971,415 | 11/1990 | Hara | 350/96.11 |
| 4,993,036 | 2/1991 | Ikeda | 372/50 |
| 5,177,753 | * 1/1993 | Tanake et al. | 438/25 |
| 5,231,642 | 7/1993 | Scifres | 372/45 |
| 5,412,748 | * 5/1995 | Furuyama et al. | 385/88 |
| 5,602,863 | 2/1997 | Itagaki | 372/50 |
| 5,666,450 | * 9/1997 | Fujimura et al. | 385/93 |
| 5,835,650 | 11/1998 | Kitaoka | 385/49 |
| 5,936,985 | 8/1999 | Yamamoto | 372/38 |
| 5,960,259 | * 9/1999 | Kitaoka et al. | 438/106 |
| 6,058,234 | * 5/2000 | Tachigori et al. | 385/49 |
| 6,067,393 | 5/2000 | Kitaoka | 385/49 |
| 6,069,904 | 5/2000 | Kitaoka | 372/32 |

FOREIGN PATENT DOCUMENTS 7-77634   3/1995  (JP) .

OTHER PUBLICATIONS

T. Nishikawa et al., "Proceedings of the 1997 IEICE General Conference", C–3–63.
Y. Yamaguchi et al., "Development of Splice for 4–Fiber Ribbon/Single Fibers Fan–out", 1997 National Convention of the Institute of Electronics, Information, and Communication Engineers of Japan, C–3–63, p. 172.
K. Yamamoto et al., Milliwatt–order blue–light generation in a periodically domain–inverted $LiTaO_3$ Waveguide, Optics Letters, vol. 16, No. 15, pp. 1156–1158, 1991.

* cited by examiner

*Primary Examiner*—Savitri Mulpuri
(74) *Attorney, Agent, or Firm*—Ratner & Prestia

(57) ABSTRACT

A wavelength-variable semiconductor laser includes: a submount; and a semiconductor laser chip being mounted onto the submount and having at least an active layer region and a distributed Bragg reflection region, wherein the semiconductor laser chip is mounted onto the submount in such a manner that an epitaxial growth surface thereof faces the submount and a heat transfer condition of the active layer region is different from a heat transfer condition of the distributed Bragg reflection region. Moreover, an optical integrated device includes at least a semiconductor laser and an optical waveguide device both mounted on a submount, wherein the semiconductor laser is the wavelength-variable semiconductor laser as set forth above.

10 Claims, 24 Drawing Sheets

WAVELENGTH-VARIABLE SEMICONDUCTOR LASER, OPTICAL INTEGRATED DEVICE UTILIZING THE SAME, AND PRODUCTION METHOD THEREOF

This application is a divisional of U.S. patent application Ser. No. 09/146,024, filed on Sep. 2, 1998.

The entire disclosure of U.S. patent application Ser. No. 09/146,024, filed on Sep. 2, 1998, is expressly incorporated by reference herein.

BACKGROUND OF THE INVENTION

1. Field of the Invention

The present invention relates to a wavelength-variable semiconductor laser, which is used in the fields of optical communication and optical information processing (e.g., optical disks, displays, and the like); an optical integrated device structured by such a wavelength-variable semiconductor laser and an optical waveguide device; and a method for producing the same. More particularly, the present intention relates to the structure of an integrated short-wavelength light source structured by a semiconductor laser chip, including the above-mentioned wavelength-variable semiconductor laser, and an optical waveguide type wavelength converting device; and a method for producing the same.

2. Description of the Related Art

In the field of optical communication, the development of a small and low-cost optical module in which a semiconductor laser, an electronic element, an optical fiber, and the like are hybrid-integrated on a quartz type light wave circuit platform has been highly valued.

The important factor to be considered in connection with the above is to fix each element with high positional accuracy so as to minimize transfer loss as much as possible. For such a purpose, a surface mounting type optical module which directly couples a semiconductor laser with a single-mode fiber using a Si substrate with a V-shaped groove has been realized (e.g., Proceedings of the 1997 IEICE General Conference, C-3-63).

According to such a technique, markers are formed on a Si substrate and a semiconductor laser element, and a center of the V-shaped groove and a light-emitting point of the semiconductor laser element are detected by the image recognition of the markers so as to perform positioning adjustment (positional alignment) with high accuracy. With such a structure, mounting deviation can be suppressed to about ±0.61 $\mu$m in an x-direction, and to about ±1 $\mu$m in a z-direction.

In the field of optical information processing, a small short-wavelength light source is demanded in order to realize a higher-density optical disk and a high definition display. Techniques for realizing a short-wavelength display includes a second harmonic-wave generation (hereinafter, referred to as "SHG") method which uses a semiconductor laser and an optical waveguide type wavelength converting device employing a quasi-phase-matching (hereinafter, referred to as "QPM") method (for example, see Yamamoto et al., Optics Letters, Vol. 16, No. 15, p. 1156, 1991).

FIG. 1 is a view showing a general structure of a blue light source using an optical waveguide type wavelength converting device.

According to the structure shown in FIG. 1, a wavelength-variable semiconductor laser 110 having a distributed Bragg reflection (hereinafter, referred to as "DBR") region is used as a semiconductor laser 110. Hereinafter, the wavelength-variable semiconductor laser having the DBR region is referred to as a "DBR semiconductor laser" or a "DBR laser".

The DBR semiconductor laser 110 is, for example, a 100 mW class AlGaAs type DBR semiconductor laser of a 0.85 $\mu$m band. The DBR semiconductor laser 110 includes an active layer region 112 and a DBR region 111. By varying a current injected into the DBR region 111, it is possible to vary an oscillation wavelength.

On the other hand, an optical waveguide type wavelength converting device 116, which serves as a wavelength converting element, includes an optical waveguide 115 formed in a X-cut MgO-doped LiNbO$_3$ substrate 113 and periodic domain-inverted regions 114. The semiconductor laser 110 and the wavelength converting device 116 are fixed onto submounts 117 and 118, respectively, in a junction-up manner.

Laser beams obtained from an outputting end surface of the DBR semiconductor laser 110 are directly coupled with the optical waveguide 115 of the optical waveguide type wavelength converting device 116. Specifically, by adjusting the positional relationship between the DBR semiconductor laser 110 and the optical waveguide type wavelength converting device 116 on the submounts 117 and 118, laser beams of about 60 mW are coupled with the optical waveguide 115 of the wavelength converting device 116 for the laser output of about 100 mW from the semiconductor laser 110. Moreover, by controlling an amount of the current injected into the DBR region 111 of the DBR semiconductor laser 110, the oscillation wavelength thereof is fixed within the allowable range of the phase matching wavelength in the optical waveguide type wavelength converting device 116. With such a structure, at present, it is possible to obtain blue light with a wavelength of 425 nm at the output of about 10 mW.

FIG. 2 is a view showing a general structure of a blue light source using a domain-inverted type waveguide device.

A DBR semiconductor laser 221 (i.e., a 100 mW class AlGaAs type DBR semiconductor laser of a 0.85 $\mu$m band) includes a DBR region 228 for fixing an oscillation wavelength. Within the DBR region 228, an internal heater (not shown) is provided so as to vary an oscillation wavelength. On the other hand, a domain-inverted type waveguide device 224 serving as a wavelength converting element includes an optical waveguide 226 formed in a X-cut MgO-doped LiNbO$_3$ substrate 225 and periodic domain-inverted regions 227.

A laser beam 229, which is output from the semiconductor laser 221 and is collimated by a collimator lens 222 (numerical aperture NA=0.5), is converged onto an end surface of the optical waveguide 226 in the domain-inverted type waveguide device 224 by a focusing lens 223 (NA=0.5). The laser beam 229 is then coupled with the optical waveguide 226 having the domain-inverted regions 227. Specifically, for a laser output of about 100 mW, it is possible to allow a laser beam of about 70 mW to be coupled with the optical waveguide 226. With such a structure, the oscillation wavelength thereof is fixed within the allowable range of the phase matching wavelength in the domain-inverted type waveguide device 224 by controlling an amount of the current injected into the DBR region 228 of the DBR semiconductor laser 221.

The blue light output thereby obtained increases in proportional to the square value of the output of the laser beam coupled with the optical waveguide 226. Therefore, coupling efficiency is a critical factor in order to obtain blue light with a high output.

In the case of the surface mounting type optical module which directly couples a semiconductor laser with a single-mode fiber, in order to couple a semiconductor laser beam into the optical fiber at a high efficiency, it is necessary to have positional adjustment (alignment) accuracy in the order of a submicron with respect to an x-direction and a y-direction which are parallel to the cross-section of the optical fiber and in the order of several microns with respect to a z-direction along the optical axis of the optical fiber. In such a case, the optical fiber is typically fixed with high accuracy by using a V-shaped groove. In addition, the semiconductor laser chip has been conventionally positioned with high accuracy with respect to an x-direction, which is parallel to the surface of the mounting substrate within the cross-section of the optical fiber, and a z-direction along the optical axis of the optical fiber. However, as to the positioning of the semiconductor laser chip with respect to a y-direction, which is parallel to the surface of the mounting substrate within the cross-section of the optical fiber, it is generally difficult to perform positioning (alignment) adjustment and fixation with the accuracy of a submicron or less due to the existence of a solder layer for fixation.

On the other hand, in the short-wavelength light source structured by a semiconductor laser and an optical waveguide type wavelength converting device (i.e., an optical waveguide device), the lens coupling type module as shown in FIG. 2 has been realized. In order to apply such a short-wavelength light source for commercial use, miniaturization of the light source and realization of low cost are essential. According to the present lens coupling type module, however, it is necessary to perform the adjustment of the lens and the semiconductor laser, resulting in low productivity. Moreover, the miniaturization of the overall size is limited to about several cc at most. Although there exists a direct coupling technique as a method for realizing further miniaturization, in order to realize a further reduction in cost of the directly coupling type module, a modularizing technique capable of realizing a more improved productivity and capable of positioning with higher accuracy is required.

The spread angle of a semiconductor laser is generally small in the direction parallel to the surface of the mounting substrate (i.e., x-direction), and large in the direction perpendicular to the surface of the substrate (i.e., y-direction). The spread angle in the optical waveguide produced by a proton exchange method is also small in the direction parallel to the surface of the mounting substrate (i.e., x-direction), and large in the direction perpendicular to the surface of the substrate (i.e., y-direction). Thus, more accurate positioning adjustment (alignment) is required in the direction perpendicular to the substrate surface (i.e., y-direction), i.e., requiring the adjustment accuracy of a submicron or less. In other words, it is necessary to control the height from the submount, onto which the semiconductor laser is mounted, to the active layer with high accuracy. However, the thickness of a GaAs substrate generally used as a substrate in an AlGaAs semiconductor laser is not typically controlled with the accuracy of a submicron level. On the other hand, the thicknesses of epitaxial layers, such as an active layer, and that of an electrode are controlled with high accuracy. Therefore, in order to control a position in a height direction (i.e, the y-direction) with high accuracy, the semiconductor laser needs to be mounted in a junction-down manner (i.e, mounted in a direction such that the surface on which the active layer is provided, i.e., the epitaxial growth surface, contacts the submount).

Moreover, with regards to a semiconductor laser mounted in a junction-up manner, the heat transfer condition in the active layer region is not satisfactory, and consequently, sufficient reliability of the laser can not be obtained. From such a standpoint, it is necessary to mount the semiconductor laser in a junction-down manner.

The DBR semiconductor laser as a wavelength-variable semiconductor laser, constituting an optical waveguide integrated light source, varies an oscillation wavelength thereof by controlling an amount of current injected into the DBR region. Specifically, by changing a temperature in the DBR region by the current injection so as to change a refractive index, the wavelength of light fedback from the DBR region is varied. According to such a principle, since the heat transfer condition in the DBR region is improved upon performing the junction-down mounting, it becomes rather difficult to realize a satisfactory control for varying an oscillation wavelength.

For fixing the optical waveguide device, it is impossible to use a structure such as a V-shaped groove which is typically used for fixing an optical fiber. Thus, especially in the y-direction, highly accurate positioning (alignment) adjustment is required.

SUMMARY OF THE INVENTION

A wavelength-variable semiconductor laser of the present invention includes: a submount; and a semiconductor laser chip being mounted onto the submount and having at least an active layer region and a distributed Bragg reflection region. The semiconductor laser chip is mounted onto the submount in such a manner that an epitaxial growth surface thereof faces the submount and a heat transfer condition of the active layer region is different from a heat transfer condition of the distributed Bragg reflection region.

Another wavelength-variable semiconductor laser of the present invention includes: a submount; and a semiconductor laser chip being mounted onto the submount and having at least an active layer region and a distributed Bragg reflection region. The semiconductor laser chip is mounted onto the submount in such a manner that an epitaxial growth surface thereof faces the submount and only the active layer region contacts the submount.

Still another wavelength-variable semiconductor laser of the present invention includes: a submount; and a semiconductor laser chip being mounted onto the submount and having at least an active layer region and a distributed Bragg reflection region. The semiconductor laser chip is mounted onto the submount in such a manner that an epitaxial growth surface thereof faces the submount. A constituent material of a first portion of the submount which contacts the active layer region is different from a constituent material of a second portion of the submount which contacts the distributed Bragg reflection region.

An optical integrated device of the present invention at least includes a semiconductor laser and an optical waveguide device both mounted on a submount, and the semiconductor laser is a wavelength-variable semiconductor laser having features as set forth above.

Another optical integrated device of the present invention includes: a submount; and a semiconductor laser chip and an optical waveguide element both mounted on the submount. A groove is provided on at least one of a surface of a portion of the submount onto which the semiconductor laser chip is fixed and a surface of a portion of the submount onto which the optical waveguide element is fixed. A fixing member for fixing the semiconductor laser chip or the optical waveguide element is provided in the groove.

Still another optical integrated device of the present invention includes: a submount; and a semiconductor laser chip and a planar type optical wavelength element both mounted on the submount. The planar type optical wavelength element is fixed onto a surface of the submount with molecular binding force.

A wavelength-variable semiconductor laser to be provided in accordance with another aspect of the present invention includes: a submount; and a semiconductor laser chip being mounted onto the submount and having at least an active layer region and a distributed Bragg reflection region. The semiconductor laser chip is mounted onto the submount in such a manner that an epitaxial growth surface thereof faces the submount. On a surface of the submount, a groove is provided which electrically isolates the active layer region and the distributed Bragg reflection region of the semiconductor laser chip.

An optical integrated device to be provided in accordance with another aspect of the present invention includes: a submount; and an array type semiconductor laser chip including two or more light emitting portions and a planar type optical wavelength element including two or more optical waveguides, both mounted on the submount. A pitch between the light emitting portions of the array type semiconductor laser chip is equal to a pitch of the optical waveguides of the planar type optical wavelength element.

A method of producing an optical integrated device of the present invention includes: a first mounting step of mounting an array type semiconductor laser chip including two or more light emitting portions onto a submount; a second mounting step of mounting a planar type optical wavelength element including two or more optical waveguides, a pitch between the optical waveguides being equal to a pitch between the light emitting portions, at a prescribed position on the submount; and a cutting step of cutting the submount into separate pieces, wherein each of the pieces includes at least one pair of the light emitting portion of the array type semiconductor laser chip and the optical waveguide of the planar type optical wavelength element.

Thus, the invention described herein makes possible the advantages of (1) providing a wavelength-variable semiconductor laser capable of realizing a stable wavelength varying operation even when mounted in a junction down manner, (2) providing an optical integrated device constituted with a semiconductor laser chip, including a wavelength-variable semiconductor as set forth above, and an optical waveguide device, which is capable of coupling a laser beam from the semiconductor laser chip with an optical waveguide in the optical waveguide device at a high efficiency by improving mounting accuracy in a thickness direction of a substrate; (3) providing an optical integrated device capable of efficiently and easily adjusting a large number of optical couplings simultaneously within a short period of time by using an array type semiconductor laser chip having two or more light emitting regions and an optical waveguide device having two or more optical waveguides; (4) providing a method for producing an optical integrated device capable of easily producing an optical integrated device having characteristics as described above at a high productivity; and (5) realizing, specifically, a short-wavelength light source of micro-small size which emits light from the blue region to the green region by using an optical waveguide type wavelength converting device as an optical waveguide device.

These and other advantages of the present invention will become apparent to those skilled in the art upon reading and understanding the following detailed description with reference to the accompanying figures.

DESCRIPTION OF THE PREFERRED EMBODIMENTS

Figure 1:
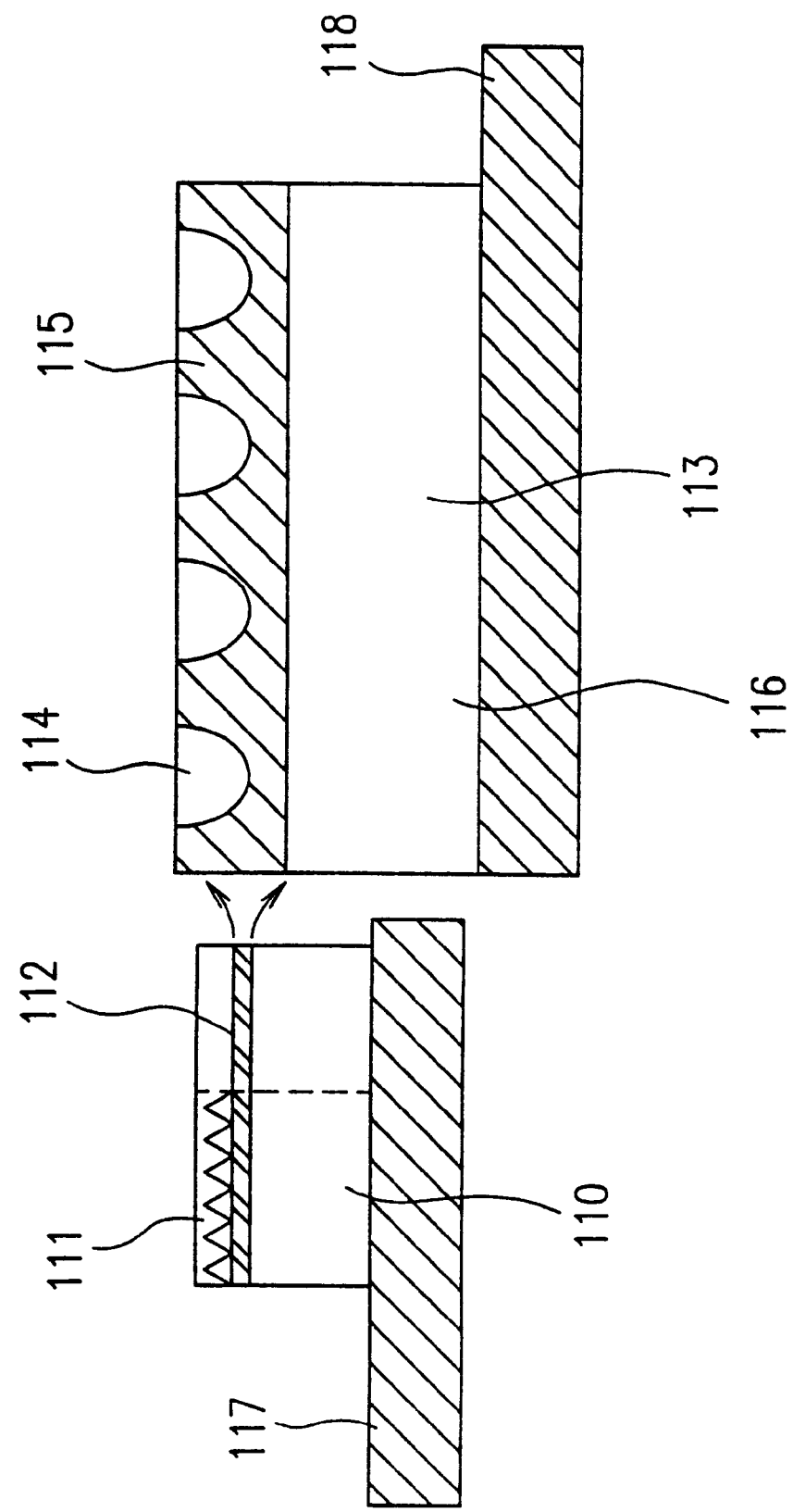
FIG. 1 is a view schematically showing one example for the structure of a conventional blue light source using an optical waveguide type wavelength converting device.
Figure 2:
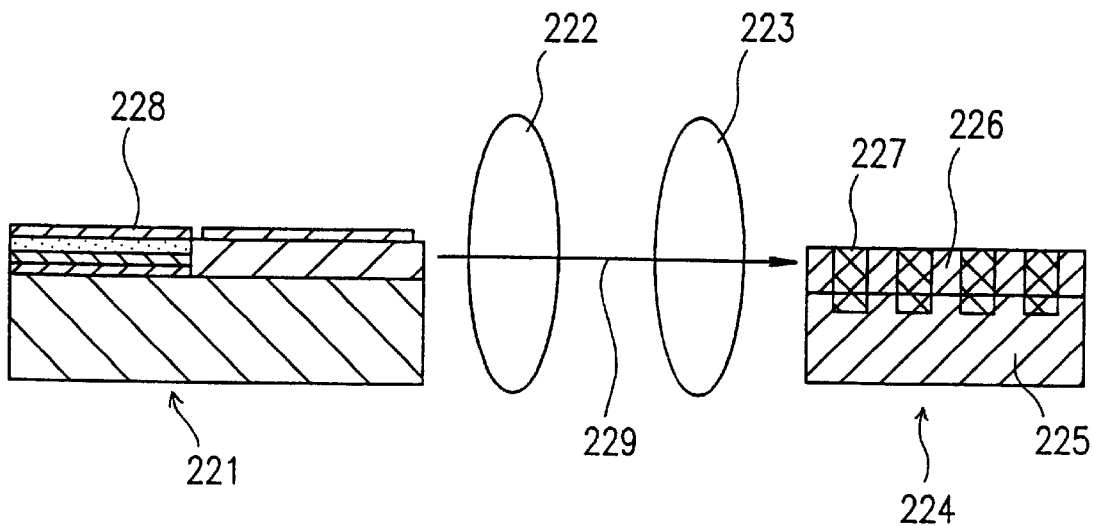
FIG. 2 is a view schematically showing one example for the structure of a conventional blue light source using a domain-inverted type optical waveguide device.

One aspect of the present invention relates to realization of a high output operation of a semiconductor laser in a highly reliable manner and stable operating characteristics of a wavelength-variable semiconductor laser in an optical waveguide device integrated light source using a DBR semiconductor laser as a wavelength-variable semiconductor laser. In particular, in a short-wavelength light source structured by the DBR semiconductor laser as a wavelength-variable semiconductor laser and an optical waveguide type wavelength converting device as an optical waveguide device, the present invention is essential for realizing a direct-coupling type micro-module in which the DBR semiconductor laser is mounted in a junction-down manner.

The reasons for mounting the DBR semiconductor laser in a junction-down manner include the following:

(1) It is possible to control a height from a submount to an active layer (i.e., a junction region) with high accuracy; and in a direct coupling with the optical waveguide device, it is possible to easily perform positioning (alignment) adjustment in a height direction of the active layer and the optical waveguide.

(2) The junction-down mounting is advantageous in prolonging laser lifetime and realizing a high laser output since a heat transferring level in the active layer region is high.

In general, methods for varying an oscillation wavelength of the wavelength-variable semiconductor laser includes: (1) utilization of a change in a refractive index due to carrier injection (i.e., utilization of the plasma effect such that a refractive index reduces when carriers are injected), and (2) utilization of a change in a refractive index due to a change in a temperature caused by the current injection into a high resistance layer (i.e., utilization of the heater effect such that a refractive index is increased by the current injection). With respect to a long-wavelength semiconductor laser such as an InP type semiconductor laser, the influence of the plasma effect described in the aforementioned method (1) is dominant. On the other hand, with respect to an AlGaAs type semiconductor laser, the influence of the heater effect described in the aforementioned method (2) is dominant.

According to the short-wavelength light source described as a conventional technique, light emitted from the AlGaAs type wavelength-variable semiconductor laser is used as a fundamental wave. Therefore, a wavelength is varied by utilizing the heater effect. If junction-down mounting is performed on a submount, heat transferring characteristics become excessively improved. Thus, it becomes difficult to vary a wavelength in a stable manner, and power consumption is also increased. In particular, according to the optical waveguide type wavelength converting device used in the short-wavelength light source with the structure described as a conventional technique, the allowable width of its phase matching wavelength is as small as about 0.1 nm. Due to such a small allowable width, it becomes necessary to realize wavelength control (i.e, selectivity) with improved accuracy.

Hereinafter, as methods capable of realizing a stable wavelength varying operation even when the wavelength-variable semiconductor laser is mounted in a junction-down manner, several examples regarding the mounting structures of the wavelength-variable semiconductor laser, and short-wavelength light sources using the same, according to the present invention will be described with reference to the accompanying drawings.

EXAMPLE 1

In Example 1 of the present invention, the structure in which a DBR semiconductor laser 1 having a DBR region 3 and an active layer region 2 is mounted on a submount 5 will be described with reference to FIGS. 3A and 3B. More specifically, the perspective view of FIG. 3A and the cross-sectional view of FIG. 3B schematically show the device structure such that the DBR semiconductor laser 1 is mounted on the submount 5 in a junction-down manner, and only the active layer region 2 thereof is fixed onto the submount 5.

Reference numeral 1 denotes a 100 mW class AlGaAs type DBR semiconductor laser which oscillates in a TE mode at a wavelength of 850 nm. Electrodes (an upper electrode 15a and a lower electrode 15b) are provided on a substrate-side surface and a active-layer side surface in the DBR semiconductor laser 1, respectively. Of these two electrodes 15a and 15b, the lower electrode 15b formed on the active-layer side surface is separated between the active layer region 2 and the DBR region 3. The thicknesses of an epitaxial layer such as the active layer and those of the electrodes are controlled in the order of a submicron or less, and the thickness up to the active layer (i.e., a junction region 4) is about 3 μm.

Reference numeral 5 denotes a Si submount. An electrode 13 having a controlled thickness and an Au/Sn layer 14 serving as a solder layer 14 are deposited thereon. According to the present example, the length of the submount 5 is designed so as to be slightly shorter than that of the active layer region 2, and only the active layer region 2 is fixed onto the submount 5.

A wire 12 is connected to each electrode for electrical connection. Regarding the lower electrode 15b in the active layer region 2, however, since the lower electrode 15b is fixed to the Si submount 5, it is not directly connected to the wire 12. Instead, the wire 12 is connected to the electrode 13 on the Si submount 5. On the other hand, as shown in FIGS. 3A and 3B, the wires 12 are connected to the upper electrode 15a and the lower electrode 15b in the DBR region 3.

Figure 3A:
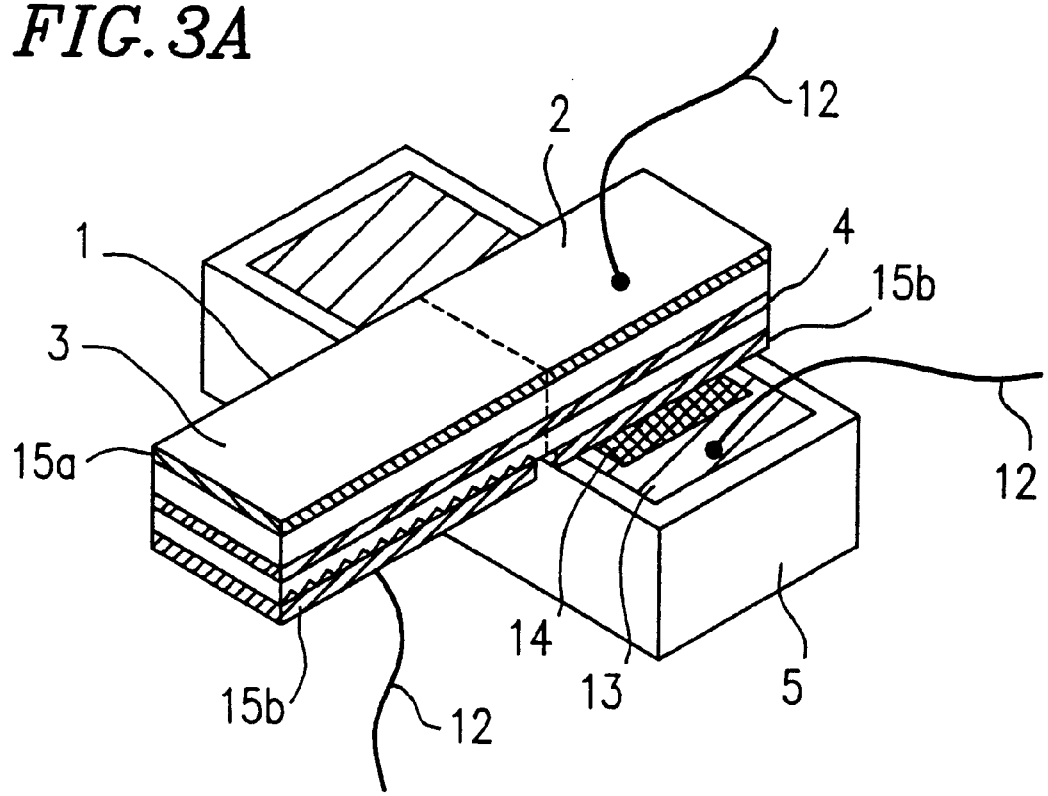
FIG. 3A is a perspective view schematically showing the structure of a wavelength-variable semiconductor laser according to Example 1 of the present invention.
Figure 3B:
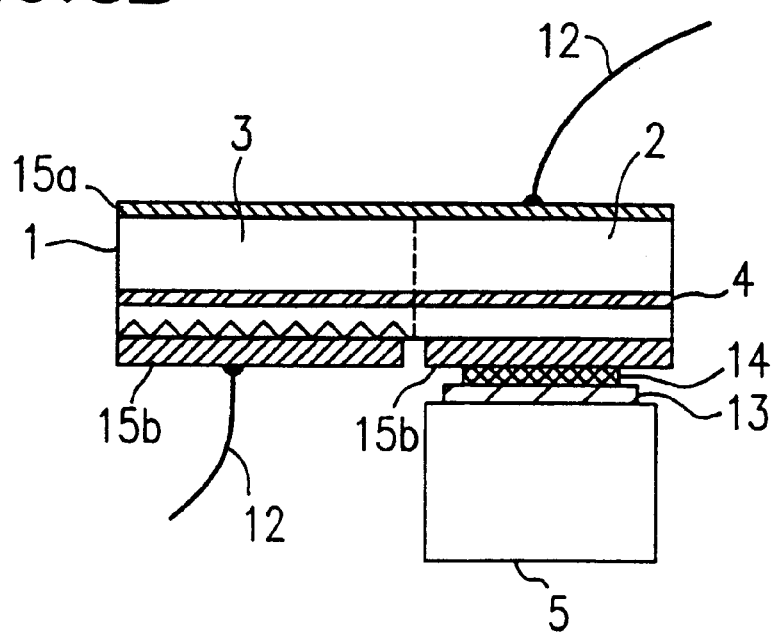
FIG. 3B is a cross-sectional view schematically showing the structure of the wavelength-variable semiconductor laser according to Example 1 of the present invention.

In the structure of FIGS. 3A and 3B, an oscillation threshold current is about 20 mA, which is less than that in a conventional device by an amount of about 5 mA. Moreover, a driving current when the output is about 100 mW is about 140 mA, which is less than that in a conventional device by an amount of about 30 mA. As a result, longer lifetime and improved reliability of the laser can be realized.

Since the DBR region 3 does not contact the submount 5, the heat transferring condition thereof is intentionally set to be inferior to that in the active layer region 2. Therefore, according to wavelength variable characteristics in the DBR semiconductor laser 1 having the structure shown in FIGS. 3A and 3B, a wavelength-variable range of about 2 nm is obtained for the current injection amount of about 80 mA in the same manner as that when junction-up mounting is employed.

As described above, when the DBR semiconductor laser 1 is mounted in a junction-down manner (i.e., in such a manner that an epitaxial growth surface thereof faces the submount 5) as in the present example, only the active layer region 2 is fixed to the submount 5, and the DBR region 3 is not fixed thereto. With such a structure, it is possible to obtain stable wavelength variable characteristics and highly reliable laser driving characteristics, leading to significant practical advantages.

EXAMPLE 2

Figure 4A:
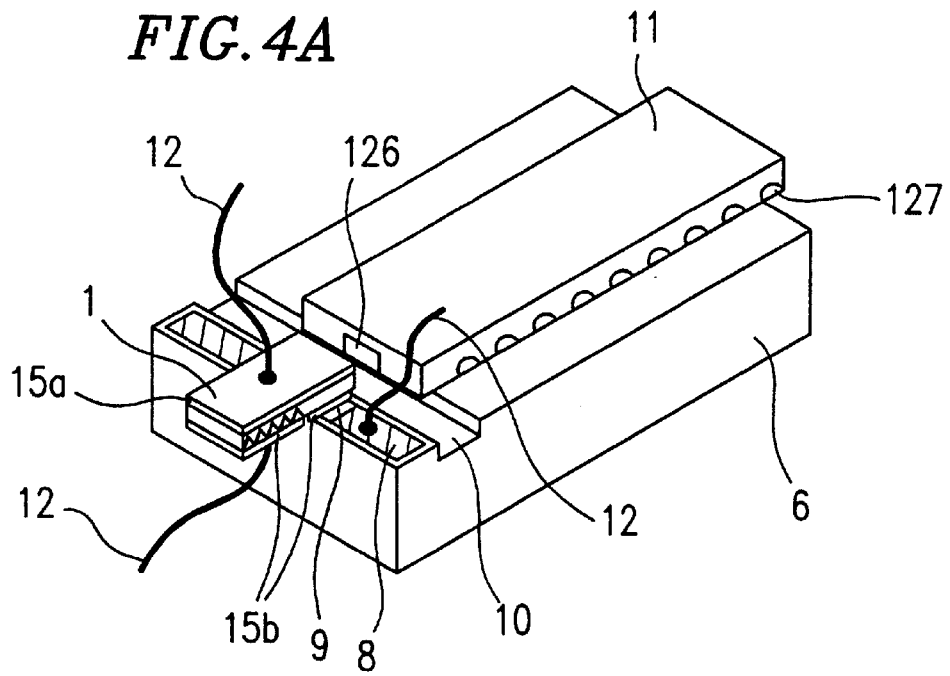
FIG. 4A is a perspective view schematically showing the structure of a short-wavelength light source according to Example 2 of the present invention.
Figure 4B:
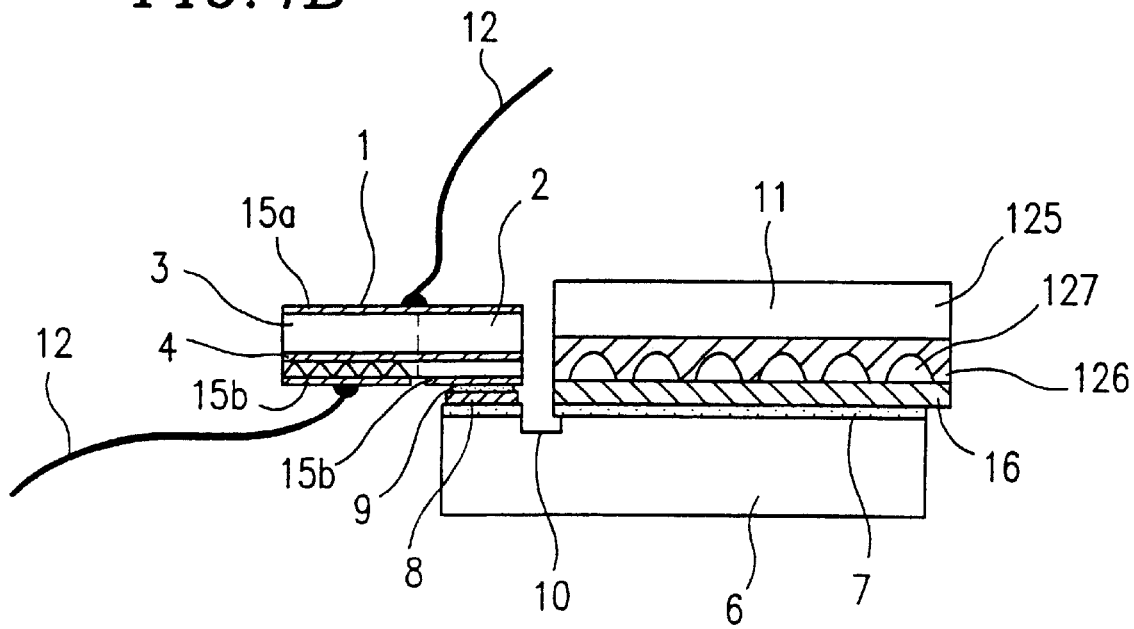
FIG. 4B is a cross-sectional view schematically showing the structure of the short-wavelength light source according to Example 2 of the present invention.

The perspective view of FIG. 4A and the cross-sectional view of FIG. 4B schematically show the structure of a short-wavelength micro-size light source such that a DBR semiconductor laser 1 as a wavelength-variable semiconductor laser and an optical waveguide type wavelength converting device 11 as an optical waveguide device are mounted on a submount 6. Specifically, the optical waveguide type wavelength converting device 11 in which a proton exchange optical waveguide 126 and periodic domain-inverted regions 127 are provided on an x-cut MgO-doped LiNbO$_3$ substrate 125 is used as the optical waveguide device of the present example.

A SiO$_2$ layer 7 is formed on the surface of the Si submount 6 as an insulation layer by means of oxidation. Next, resist patterns for a cross-shaped key (not shown) for positional adjustment (alignment) and an electrode 8 are formed again by photo process. Thereafter, an Au film is deposited according to the patterns. Moreover, an Au/Sn layer 9 as a solder layer (i.e., a fixing member) is deposited on the electrode 8. A groove 10 is formed on the Si submount 6, and the length of the DBR semiconductor laser 1 is adjusted so that only the active layer region 2 thereof is fixed to the submount 6.

Upon mounting the structure shown in FIGS. 4A and 4B, first, the DBR semiconductor laser 1 is fixed on the Si submount 6. Specifically, images of the cross-shaped keys (not shown) for positional adjustment (alignment), respectively provided on the DBR semiconductor laser 1 and the Si submount 6, are recognized by individual cameras so as to detect respective center lines thereof. The DBR semiconductor laser 1 is moved by a precision stage to a position where these center lines coincide with each other. The DBR semiconductor laser 1 is fixed to a tool by a vacuum sweeper. On the other hand, the Si submount 6 is fixed to a stand having a pulse heater. Next, the image of an outputting end surface of the DBR semiconductor laser 1 is recognized, and positioning adjustment is performed so that the outputting end surface of the DBR semiconductor laser 1 protrudes slightly over the groove 10 on the Si submount 6. After the fixation position is determined, the Si submount 6 is pulse-heated, thereby melting the Au/Sn layer 9 so as to fix the DBR semiconductor laser 1. Accordingly, only the active layer region 2 of the DBR semiconductor laser 1 is fixed onto the Si submount 6 in a junction-down manner.

Next, the optical waveguide type wavelength converting device 11 is fixed onto the Si submount 6. The optical waveguide 126 fabricated on the x-cut substrate 125 is capable of waveguiding solely TE-mode light. As a result, planar type direct coupling can be realized. Moreover, a protection film 16 for positioning adjustment in a thickness direction (i.e., the y-direction) is formed on the surface of the optical waveguide type wavelength converting device 11. The protection film 16 is made, for example, of a SiO$_2$ sputtering film, and a thickness thereof is precisely controlled.

In order to fix the optical waveguide type wavelength converting device 11, an UV curing agent, for example, may be used. As in the semiconductor laser chip 1, cross-shaped keys (not shown) are formed on the Si submount 6 and the optical waveguide type wavelength converting device 11. The optical waveguide type wavelength converting device 11 is moved so that the center line of the cross-shaped key on the optical waveguide type wavelength converting device 11 and that of the cross-shaped key on the Si submount 6 coincide with each other, and a distance between the outputting surface of the semiconductor laser chip 1 and the inputting surface of the optical waveguide type wavelength converting device 11 is about 3 μm. Thereafter, the optical waveguide type wavelength converting device 11 is irradiated with UV light so as to be fixed while being applied with a constant amount of pressure.

Next, a wire 12 is connected to each electrode for electrical connection. As to the lower electrode 15b in the active layer region 2 of the semiconductor laser 1, however, since the lower electrode 15b is fixed to the Si submount 6, it is not directly connected to the wire 12. Instead, the wire 12 is connected to the electrode 8 on the Si submount 6. On the other hand, as shown in FIGS. 4A and 4B, the wires 12 are connected to the upper electrode 15a and the lower electrode 15b in the DBR region 3.

According to Example 2 of the present invention, since the DBR semiconductor laser 1 is mounted in a junction-down manner, laser output of about 100 mW can be obtained for the operating current of about 140 mA. Moreover, since the height of the active layer 4 and the height of the optical waveguide 126 are precisely controlled, it is possible to couple a laser beam of about 60 mW with the optical waveguide 126. Furthermore, since the DBR region 3 does not contact the submount 6, the heat transferring level thereof is intentionally suppressed as compared to that in the active layer region 2.

Therefore, stable wavelength variable characteristics can be obtained.

By changing the current injected into the DBR region 3 of the DBR semiconductor laser 1 so as to vary an oscillation wavelength such that the oscillation wavelength of the semiconductor laser 1 coincides with the phase matching wavelength of 851 nm of the optical waveguide type wavelength converting device 11, blue light with a wavelength of 425.5 nm can be obtained at the output of about 10 mW.

Moreover, according to Example 2 of the present invention, the Si submount 6 with the DBR semiconductor laser 1 and the optical waveguide type wavelength converting device 11 mounted thereon is preferably filled with $N_2$. By filling the Si submount 6 with a gas having a low heat conductivity such as $N_2$ (0.066 cal·cm$^{-1}$·sec$^{-1}$·deg$^{-1}$), heat transfer in the DBR region 3 can be prevented, and the end surfaces of the laser can be prevented from deteriorating. Therefore, the practical effect thereof is significant.

Furthermore, by filling the Si submount 6 with a gas having a heat conductivity still lower than that of $N_2$, e.g., Kr (0.021 cal·cm$^{-1}$·sec$^{-1}$·deg$^{-1}$), or by disposing the Si submount 6 in vacuum, the level of heat transfer can be reduced, thereby being capable of reducing the amount of injection current for varying a wavelength.

EXAMPLE 3

Figure 5A:
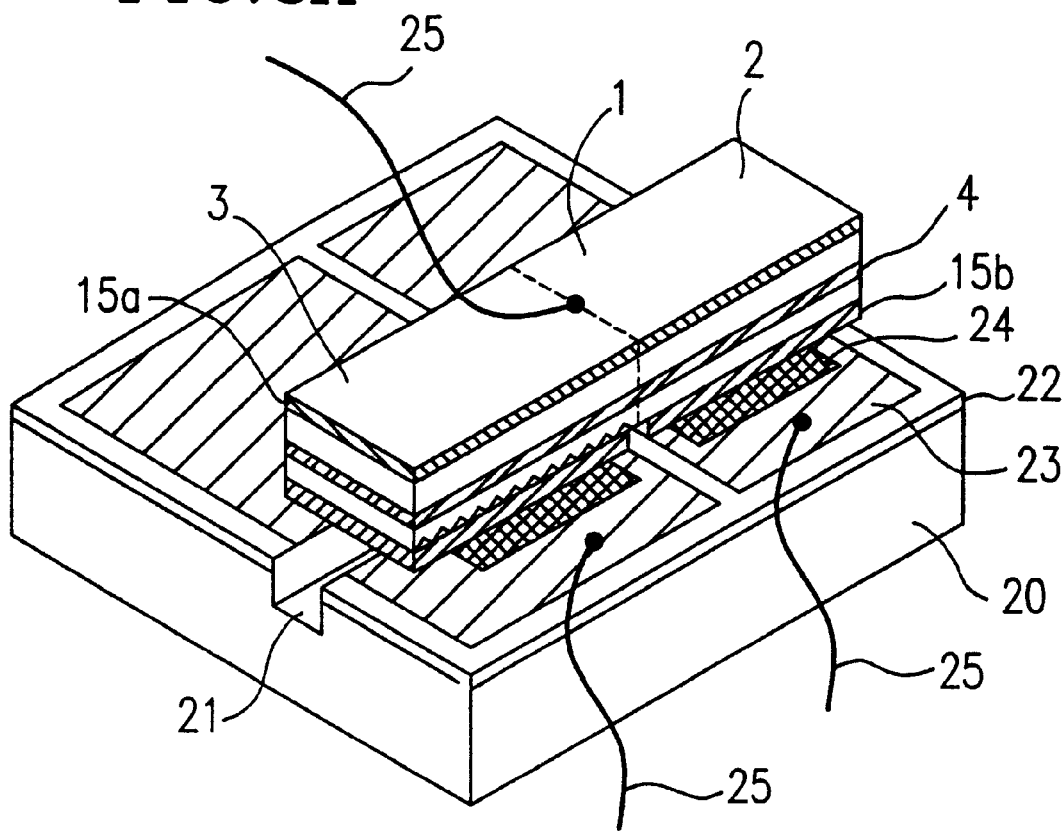
FIG. 5A is a perspective view schematically showing the structure of a wavelength-variable semiconductor laser according to Example 3 of the present invention.
Figure 5B:
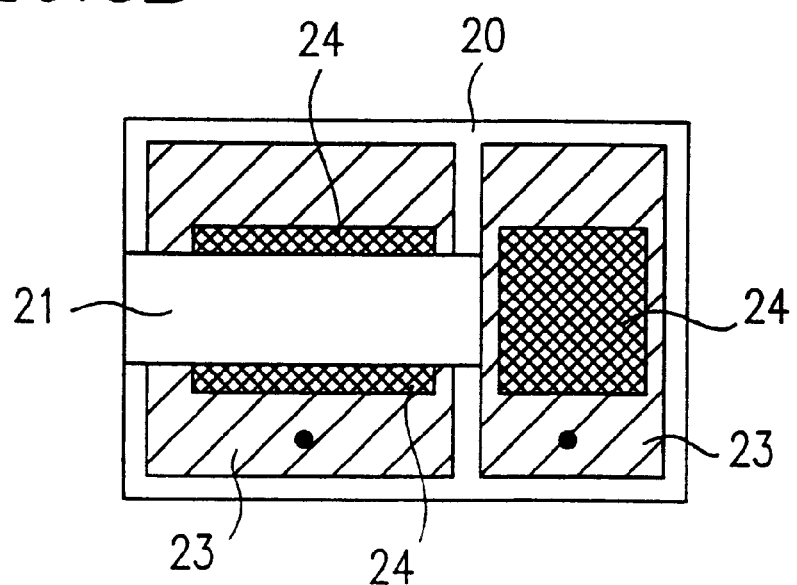
FIG. 5B is a cross-sectional view schematically showing the structure of the wavelength-variable semiconductor laser according to Example 3 of the present invention.

As in Example 1 of the present invention, a DBR semiconductor laser 1 having a DBR region 3 is used as a wavelength variable semiconductor laser in Example 3 of the present invention. The perspective view of FIG. 5A and the cross-sectional view of FIG. 5B schematically show the apparatus structure such that the DBR semiconductor laser 1 is mounted on a Si submount 20 in a junction-down manner, and the active layer region 2 and a part of the DBR region 3 are fixed onto the submount 20.

The device structure of the present example differs from the device structure of Example 1 in that a groove 21 is formed on the Si submount 20. The groove 21 may be formed by a photolithography process and a dry etching process. A width of the groove 21 is smaller than that of the DBR semiconductor laser 1, so that a part of the DBR region 3 is also fixed onto the Si submount 20.

A $SiO_2$ layer 22 is formed on the surface of the Si submount 20 as an insulation layer by oxidation. Au layers 23 serving as electrodes 23 and Au/Sn layers 24 serving as solder layers 24 for fixation are deposited thereon in this order. The electrode 23 and the solder layer 24 in the active layer region 2 and the electrode 23 and the solder layer 24 in the DBR region 3 are electrically isolated from each other. Moreover, an electrode 15b over an active layer 4 of the DBR semiconductor laser 1 is divided into the active layer region 2 part and the DBR region 3 part, and these two parts are electrically isolated from each other. The DBR semiconductor laser 1 is fixed onto the submount 20 in a junction-down manner such that the region isolating the electrodes 23 and the solder layers 24 coincide with the region dividing the electrode 15b. Upon mounting the DBR semiconductor 1, the active layer region 2 is fixed so that the entire surface thereof contacts the submount 20. On the other hand, the DBR region 3 is fixed so that a part of the surface thereof contacts the submount 20.

Next, a wire 25 is connected to each electrode for electrical connection. As to the lower electrode 15b of the DBR semiconductor laser 1, however, since the lower electrode 15b is fixed on the Si submount 20 in both of the active layer region 2 and the DBR region 3, the electrode 15b is not directly connected to the wire 25. Instead, the wires 25 are connected to the electrodes 23 on the Si submount 20. On the other hand, as shown in FIGS. 5A and 5B, the wire 25 is connected to the upper electrode 15a. In this case, since the wire 25 is connected to any of the electrodes from the upper side, the formation thereof is easily performed.

According to the structure of the thus-fabricated device of Example 3, an oscillation threshold current is about 20 mA, and a driving current for the output of about 100 mW is about 140 mA. Moreover, since only a part of the DBR region 3 contacts the submount 20, the heat transferring level thereof is intentionally suppressed as compared to that in the active layer region 2. Therefore, the wavelength variable characteristics is substantially the same as that when junction-up mounting is performed, and a wavelength variable range of about 2 nm can be obtained for a current injection amount of about 90 mA.

According to Example 3 of the present invention, when the DBR semiconductor laser 1 is mounted in a junction-down manner, the entire surface of the active layer region 2 is fixed onto the submount 20, while only a part of the DBR region 3 is fixed onto the submount 20. By employing such a structure, it is possible to obtain stable wavelength variable characteristics and highly reliable laser driving characteristics, leading to significant practical advantages. Furthermore, according to the structure of Example 3, since heat distribution (i.e, heat transfer distribution) in the DBR region 3 is smaller as compared to the structure of Example 1, more stable wavelength variable characteristics in a single-longitudinal mode can be obtained.

EXAMPLE 4

Figure 6A:
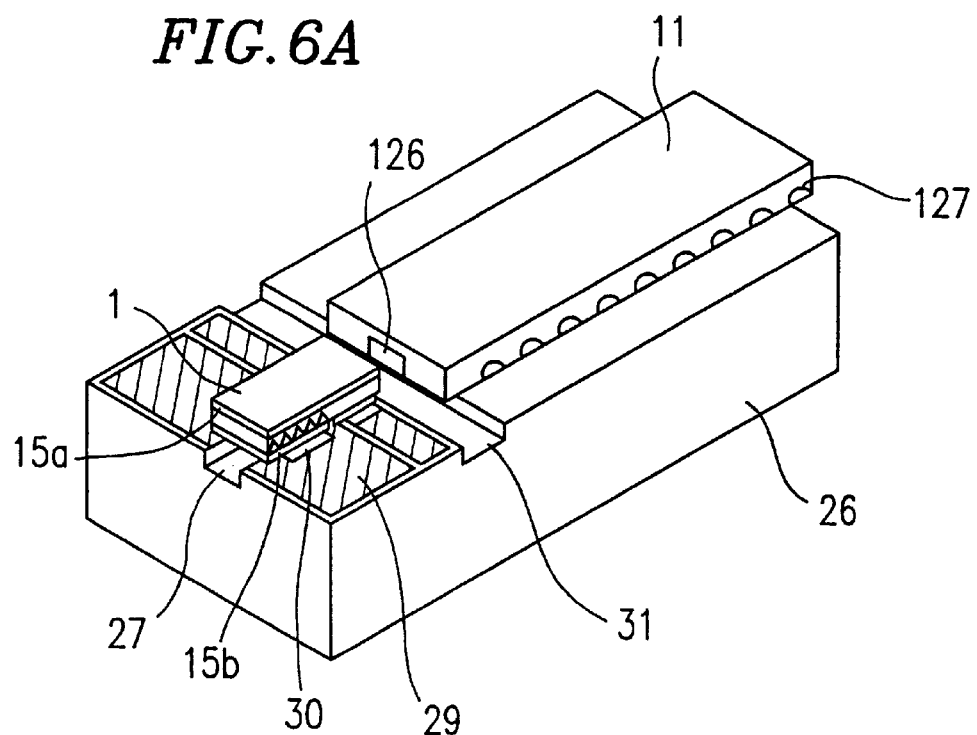
FIG. 6A is a perspective view schematically showing the structure of a short-wavelength light source according to Example 4 of the present invention.
Figure 6B:
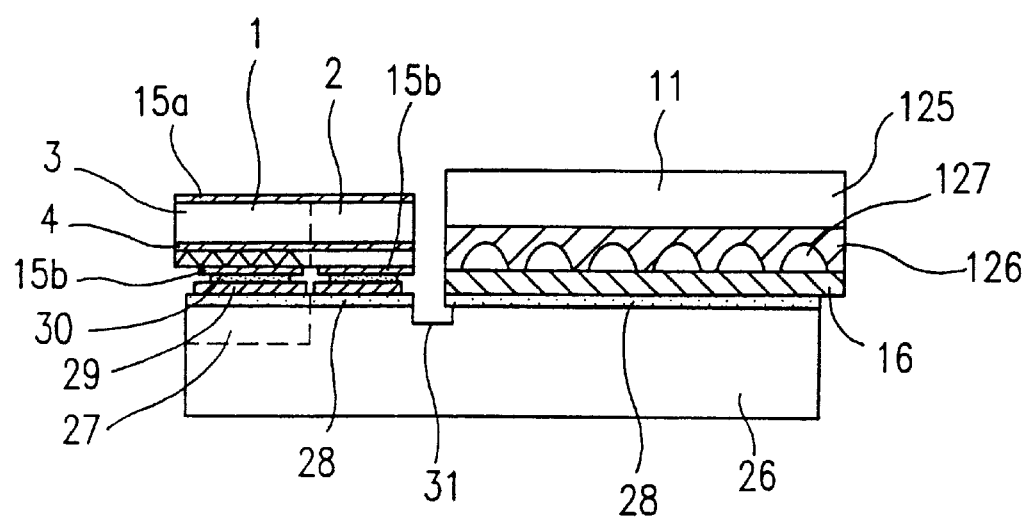
FIG. 6B is a cross-sectional view schematically showing the structure of the short-wavelength light source according to Example 4 of the present invention.

The perspective view of FIG. 6A and the cross-sectional view of FIG. 6B schematically show the structure of a short-wavelength micro-size light source such that a DBR semiconductor laser 1 as a wavelength-variable semiconductor laser and an optical waveguide type wavelength converting device 11 as an optical waveguide device are mounted on a submount 26. Specifically, the optical waveguide type wavelength converting device 11 in which a proton exchange optical waveguide 126 and periodic domain-inverted regions 127 are provided on a x-cut MgO-doped $LiNbO_3$ substrate 125 is used as the optical waveguide device 11 in the present example.

The device structure of the present example differs from the device structure of Example 2 in that a groove 27 is formed on a Si submount 26. The groove 27 is typically formed by a photolithography process and a dry etching process. A width of the groove 27 is smaller than that of the DBR semiconductor laser 1, so that a part of the DBR region 3 is also fixed onto (i.e., contacts) the Si submount 26.

Moreover, as in the structure of Example 3 of the present invention, a $SiO_2$ layer 28, an electrode 29, and a solder layer (i.e., an Au/Sn layer) 30 are formed on the surface of the submount 26. The $SiO_2$ layer 28, the electrode 29, and the solder layer 30 are divided into an active layer region 2 part and a DBR region 3 part, respectively, and these parts are electrically isolated from each other.

The mounting of the structure of FIGS. 6A and 6B is performed in the same manner as that in Example 2 of the present invention. That is, first, the DBR semiconductor laser 1 is fixed onto the Si submount 26. Specifically, cross-shaped keys (not shown) for positional adjustment (alignment) are provided on the DBR semiconductor 1 and the Si submount 26, respectively, and images of these cross-shaped keys are recognized by individual cameras so as to detect respective center lines thereof. The DBR semiconductor laser 1 is then moved by a precision stage to a position where these center lines coincide with each other. Next, the image of an outputting end surface of the DBR semiconductor laser 1 is recognized, and positioning adjustment is performed so that the outputting end surface of the DBR semiconductor laser 1 protrudes slightly over the groove 31 on the Si submount 26. After the fixation position is determined, the Si submount 26 is pulse-heated, thereby melting the Au/Sn layer 30 so as to fix the DBR semiconductor laser 1. Accordingly, the DBR semiconductor laser 1 is fixed onto the Si submount 26 in a junction-down manner. Subsequently, in the same manner as that in Example 2 of the present invention, the optical waveguide type wavelength converting device 11 is fixed onto the Si submount 26.

According to the thus-structured present example, an oscillation threshold current of the DBR semiconductor laser 1 is about 20 mA, and a driving current for the output of about 100 mW is about 140 mA. Moreover, when the amount of current injection into the DBR region 3 is about 90 mA, a wavelength-variable range of about 2 nm can be obtained. Furthermore, since the height of the active layer 4 and the height of the optical waveguide 126 are precisely controlled, it is possible to couple a laser beam of about 60 mW with the optical waveguide 126.

By changing the current injected into the DBR region 3 of the DBR semiconductor laser 1 so as to vary an oscillation wavelength such that the oscillation wavelength of the semiconductor laser 1 coincides with the phase matching wavelength of 851 nm of the optical waveguide type wavelength converting device 11, blue light with a wavelength of 425.5 nm can be obtained at the output of about 10 mW. Moreover, according to the structure of the present example, since heat distribution (i.e, heat transfer distribution) in the DBR region 3 is smaller than that in the structure of Example 2, more stable single-longitudinal mode oscillation and more stable output of blue light can be realized.

EXAMPLE 5

In Example 5 of the present invention, more stable laser oscillation and wavelength variable characteristics are realized by structuring a submount 35 as the combination of two portions 35A and 35B made of materials having respectively different heat conductivities so as to generate a difference in heat transferring conditions between an active layer region 2 and a DBR region 3 of a DBR semiconductor laser 1, as described below.

For structuring the submount 35 by combining materials having respectively different heat conductivities, the submount 35 can be easily formed with a high processability by using ceramic materials. Examples for a ceramic material having an excellent heat conductivity include AlN (heat conductivity: 0.4 cal·cm$^{-1}$·sec$^{-1}$·deg$^{-1}$) and SiC (heat conductivity: 0.15 cal·cm$^{-1}$·sec$^{-1}$·deg$^{-1}$) with a heat conductivity which is substantially the same as that of Si (heat conductivity: 0.3 cal·cm$^{-1}$·sec$^{-1}$·deg$^{31\ 1}$). Examples for a ceramic material having a poor heat conductivity include ZrO$_2$ (heat conductivity: 0.01 cal·cm$^{-1}$·sec$^{-1}$·deg$^{-1}$).

Figure 7A:
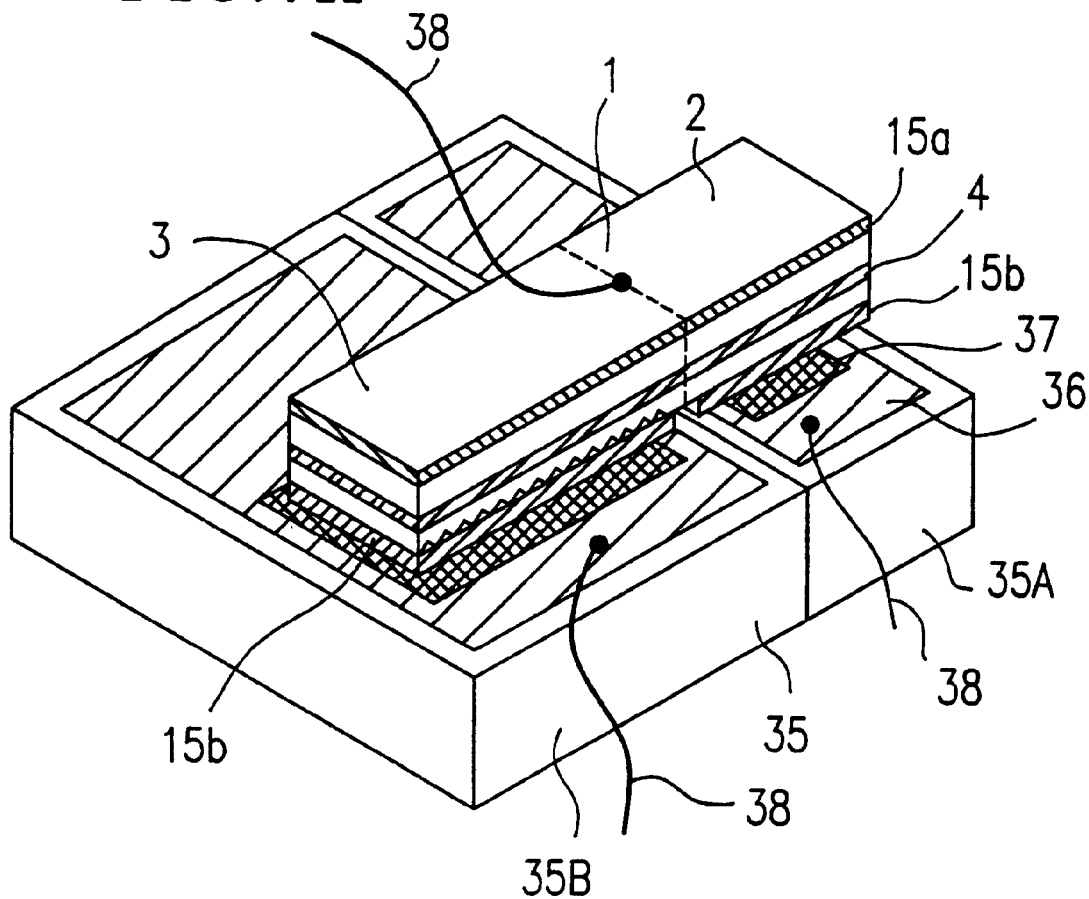
FIG. 7A is a perspective view schematically showing the structure of a wavelength-variable semiconductor laser according to Example 5 of the present invention.
Figure 7B:
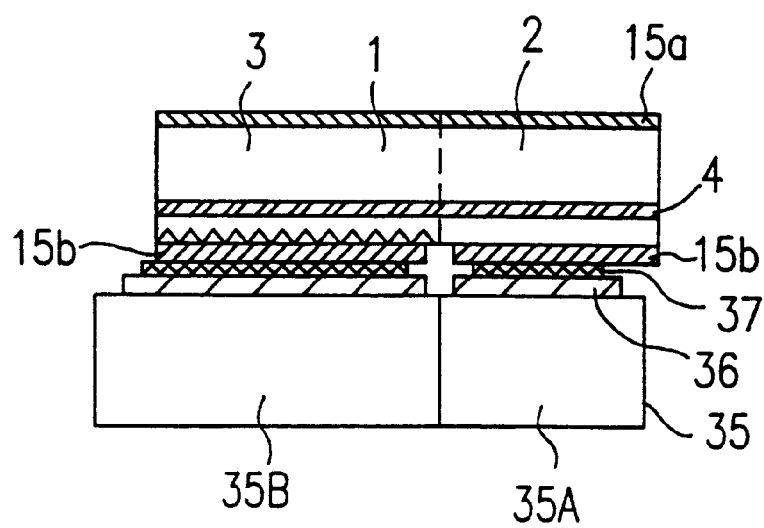
FIG. 7B is a cross-sectional view schematically showing the structure of the wavelength-variable semiconductor laser according to Example 5 of the present invention.

The perspective view of FIG. 7A and the crosssectional view of FIG. 7B schematically show the structure of a wavelength-variable semiconductor laser such that the DBR semiconductor laser 1 is mounted on the submount 35 formed of AlN and ZrO$_2$.

The submount 35 includes a portion 35A to which the active layer region 2 of the DBR semiconductor laser 1 is fixed and a portion 35B to which the DBR region 3 is fixed. The constituent material for the portion 35A is AlN, and the constituent material for the portion 35B is ZrO$_2$. Moreover, as in the structures of the aforementioned examples, electrodes 36 and solder layers 37 are provided on the submount 35, and the portion 35A and the portion 35B are electrically isolated from each other. Furthermore, lower electrode 15b positioned at the side closer to an active layer 4 of the DBR semiconductor laser 1 is divided into two parts electrically isolated from each other. The DBR semiconductor laser 1 is fixed onto the submount 35 in a junction-down manner so that the separated two parts of the lower electrode 15b correspond to the two portions 35A and 35B of the submount 35, respectively. After completing the bonding of the DBR semiconductor laser 1, as shown in FIG. 7A, a wire 38 is made from each electrode.

Since the portion 35A of the submount 35 is formed of AlN, heat generated in the active layer region 2 of the DBR semiconductor laser 1 is efficiently transferred to the submount 35. On the other hand, since the portion 35B of the submount 35 is made of ZrO$_2$, heat transfer from the DBR region 3 to the submount 35 is reduced.

According to Example 5 of the present invention, since AlN having a higher heat conductivity than Si, which is employed in Examples 1 through 4, is used as a constituent material for the submount 35, heat transferring characteristics in the active layer region 2 are improved. An oscillation threshold current of the DBR semiconductor laser 1 is about 20 mA, and a driving current for the output of about 100 mW is about 130 mA. On the other hand, since the heat transferring condition in the DBR region 3 is reduced due to the use of ZrO$_2$, a wavelength-variable range of about 2 nm can be obtained for the current injection amount of about 100 mA.

According to the present example, in the submount 35 on which the DBR semiconductor laser 1 is mounted, a constituent material having a high heat conductivity is used for the portion 35A corresponding to the active layer region 2, and a material having a low heat conductivity is employed for the portion 35B corresponding to the DBR region 3. As a result, it is possible to obtain highly reliable laser driving characteristics and stable wavelength-variable characteristics.

Although the entire surface of the DBR region 3 is fixed onto the portion 35B of the submount 35 in the present example, by forming a groove with a suitable pattern in the portion 35B made of ZrO$_2$ in the same manner as that in Example 3, it becomes possible to further reduce the heat conductivity intentionally, thereby obtaining more stable wavelength variable characteristics.

EXAMPLE 6

Figure 8A:
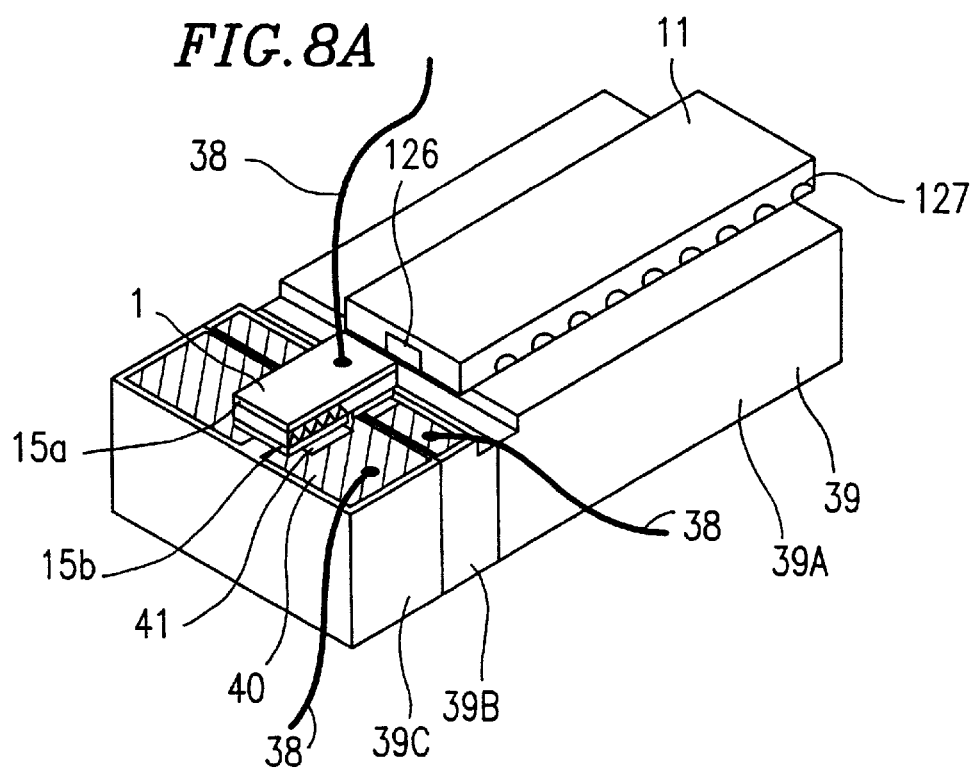
FIG. 8A is a perspective view schematically showing the structure of a short-wavelength light source according to Example 6 of the present invention.
Figure 8B:
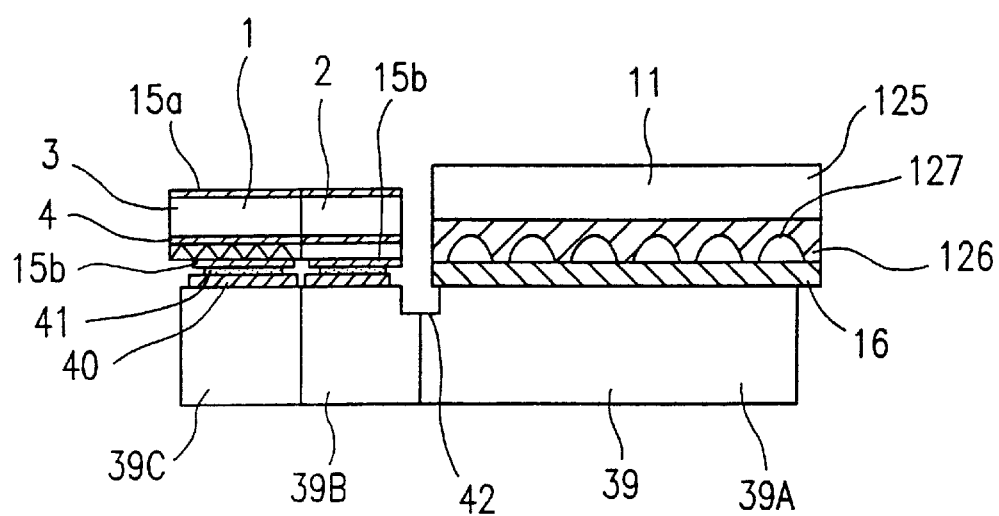
FIG. 8B is a cross-sectional view schematically showing the structure of the short-wavelength light source according to Example 6 of the present invention.

The perspective view of FIG. 8A and the cross-sectional view of FIG. 8B schematically show the structure of a short-wavelength micro-size light source such that a DBR semiconductor laser 1 as a wavelength-variable semiconductor laser and an optical waveguide type wavelength converting device 11 as an optical waveguide device are mounted on a submount 39. Specifically, the optical waveguide type wavelength converting device 11 in which a proton exchange optical waveguide 126 and periodic domain-inverted regions 127 are provided on an x-cut MgO-doped LiNbO$_3$ substrate 125 is used as an optical waveguide device of the present example.

The submount 39 consists of three portions below: Portion 39A to which the optical waveguide type wavelength converting device is fixed; Portion 39B to which an active layer region is fixed; and Portion 39C to which a DBR region is fixed.

The portion 39A and the portion 39C are formed of ZrO$_2$ ceramic, whereas the portion 39B is formed of AlN ceramic. In the same manner as that in the above-described examples, electrodes 40 and solder layers 41 are provided at portions on the surface of the submount 39, to which the DBR semiconductor laser 1 is fixed. A groove 42 is provided in an area between the portion to which the DBR semiconductor laser 1 is fixed and the portion to which the optical waveguide type wavelength converting device 11 is fixed.

In the same manner as that in Example 4, the DBR semiconductor laser 1 and the optical waveguide type wavelength converting device 11 are fixed onto the submount 39, and a wire 38 is made from each electrode. Then, the operating characteristics of the DBR semiconductor laser 1 were measured. As a result, an oscillation threshold current was about 20 mA, and a driving current was about 130 mA when the output was 100 mW. Also, when the amount of current injection into the DBR region 3 was about 100 mA, a wavelength-variable range of about 2 nm was obtained.

The phase matching wavelength of the optical waveguide type wavelength converting device 11 has temperature dependency. Thus, temperature distribution inside the optical waveguide type wavelength converting device 11 due to the heat from an active layer 4 of the DBR semiconductor laser 1 affects the wavelength converting efficiency or operating stability of the optical waveguide type wavelength converting device 11. Therefore, according to the above-described structure of Example 2 or 4, for the laser output of about 100 mW, the output of only about 10 mW is obtained from the wavelength converting device. According to the structure of the present example, on the other hand, heat generated in the active layer region 2 of the DBR semiconductor laser 1 is efficiently transferred to the portion 39B of the submount 39, which is formed of AlN ceramics. In addition, since heat can be prevented from being conveyed to the optical waveguide type wavelength converting device 11 by the groove 42, it is possible to realize improved reliability of the DBR semiconductor laser 1 and improved uniformity in the optical waveguide type wavelength converting device 11. As a result, for the laser output of about 100 mW, it is possible to obtain blue output of about 15 mW from the wavelength converting device 11.

EXAMPLE 7

Figure 9A:
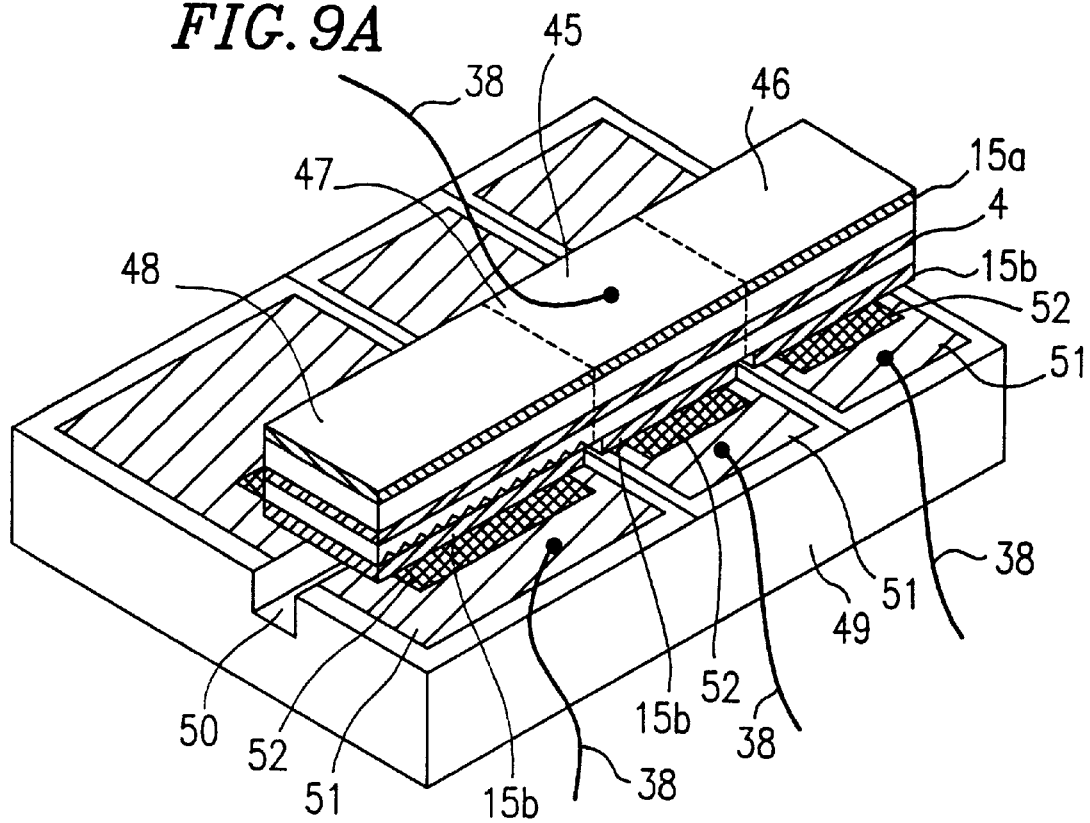
FIG. 9A is a perspective view schematically showing the structure of a wavelength-variable semiconductor laser according to Example 7 of the present invention.
Figure 9B:
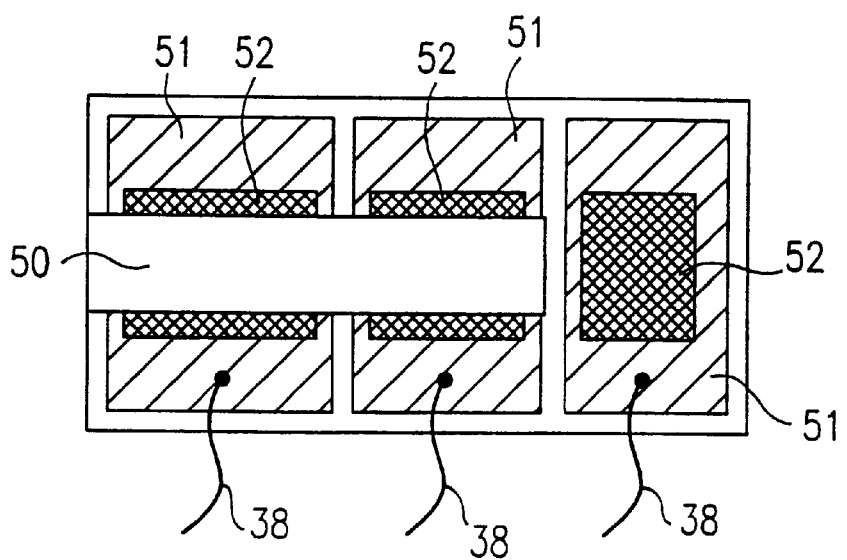
FIG. 9B is a plan view schematically showing the structure of the wavelength-variable semiconductor laser according to Example 7 of the present invention.

In Examples 1 through 6 of the present invention, the wavelength-variable semiconductor lasers and the short-wavelength light sources, each of which employs the DBR semiconductor laser 1 structured by the active layer region 2 and the DBR region 3, were described. In the present example, the structure using a DBR semiconductor laser in which a phase compensation region is further added will be described. The perspective view of FIG. 9A and the plan view of FIG. 9B schematically show such a structure.

The DBR semiconductor laser 45 contained in such a structure is a 100 mW class AlGaAs type distribution bragg reflection (DBR) type semiconductor laser oscillating in a TE mode at a wavelength of 850 nm, which is structured by an active layer region 46, a phase compensation region 47, and a DBR region 48. In the DBR semiconductor laser 45, an electrode 15a and an electrode 15b are provided on the surface closer to a substrate and on the surface closer to an active layer 4, respectively. The lower electrode 15b at the active layer side, in particular, is electrically divided among the active layer region 46, the phase compensation region 47, and the DBR region 48. In addition, thicknesses of epitaxial layers such as the active layer 4 and those of the electrodes 15a and 15b are controlled in the order of a submicron or less. The thickness to the active layer (i.e., junction region 4) is about 3 μm.

A submount 49 is made of Si, and a groove 50 is formed therein. The length of the groove 50 is substantially equal to the total length of the phase compensation region 47 and the DBR region 48 of the DBR semiconductor laser 45. Accordingly, while heat generated in the active layer region 46 transfers to the Si submount 49, heat generated by the injected current is hard to be transferred in the phase compensation region 47 and the DBR region 48.

As in the above-described examples, electrodes 51 and solder layers 52 each having controlled thicknesses are deposited on the Si submount 49. These electrodes 51 and solder layers 52 are electrically isolated from one another among portions to which the active layer region 46, the phase compensation region 47, and the DBR region 48 are respectively fixed. The electrode 51 provided at the portion to which the phase compensation region 47 is fixed has the same length as that of the phase compensation region 47.

As in the above-described examples, the DBR semiconductor laser 45 is fixed onto the submount 49, and a wire 38 is made from each electrode. Then, the operating characteristics of the DBR semiconductor laser 45 is measured. As a result, an oscillation threshold current is about 20 mA, and a driving current is about 140 mA when the output is 100 mW. Regarding wavelength variable characteristics, for the current injection amount of about 90 mA, it is possible to obtain wavelength variable characteristics of about 2 nm in continuous manner by performing phase adjustment by the phase compensation region 47 in substantially the same manner as that in the case where junction-up mounting is performed.

Even when the DBR semiconductor laser 45 including the phase compensation region 47 is mounted in a junction-down manner as in the present example, stable wavelength variable characteristics and highly reliable laser driving characteristics can be obtained, leading to significant practical advantages.

Although the present example describes the structure such that the DBR semiconductor laser 45 is mounted on the Si submount 49 with the groove 50 thereon, the same effects can be also obtained by employing the structure such that the DBR semiconductor laser 45 is mounted on the submount including a plurality of regions made of different materials (i.e., ceramics) as described in Example 5 or 6.

Although the optical waveguide type wavelength converting device is used as an optical waveguide device in each of the aforementioned Examples 1 through 7, the same effects can be obtained by using an optical waveguide type functional device such as an optical waveguide type high-speed modulation device formed on a LiNbO₃ substrate. Even when a laser beam is coupled with an optical fiber fixed on a V-shaped groove formed on a submount in the case where the DBR semiconductor laser is used as a light source for obtaining an absolute reference wavelength or a light source for realizing wavelength multiplex communication in the field of optical communication, it is possible to obtain highly reliable laser driving characteristics and stable wavelength variable characteristics by fixing the DBR semiconductor laser in the same manner as that in the above-described Examples 1 through 4.

Moreover, although the structure of the direct coupling type module is described in the aforementioned examples, similar significant practical advantages can be obtained even when the present invention is applied to the lens coupling type module. By mounting the DBR semiconductor laser on the submount in a junction-down manner in such a case, high reliability can be obtained even when oscillating at a high output. Taking the structure of Example 1 as an example, the value of the driving current for the output of about 100 mW is reduced by an amount of about 30 mA.

In order to drive a high output semiconductor laser in a stable manner, it is necessary to enhance the heat transferring condition in the semiconductor laser chip. According to the short-wavelength light source structured by the semiconductor laser and the wavelength-variable device, the resulting harmonic-wave output is proportional to the square value of the semiconductor laser output, and consequently, a high output semiconductor laser is preferably used. Thus, junction-down mounting is especially required.

In order to apply the optical integrated device structured by the semiconductor laser and the optical waveguide device for the commercial use, size and cost thereof become critical factors, and therefore, the junction-down mounting technique also becomes necessary. This is because the height from the submount to the active layer (i.e., junction region) can be accurately controlled according to the junction-down mounting technique. Thus, when the optical waveguide device is directly coupled with the semiconductor laser, positioning adjustment (alignment) in a height direction between the active layer and the optical waveguide can be readily realized.

As described above, according to Examples 1 through 7 of the present invention, in the optical waveguide integrated light source in which the DBR semiconductor laser as a wavelength-variable semiconductor laser and the optical waveguide type wavelength converting device as an optical waveguide type device, or an optical element such as an optical fiber, are fixed onto the submount, the DBR semiconductor laser is fixed onto the submount in a junction-down manner with high accuracy. While improving heat transferring characteristics in the active layer region of the DBR semiconductor laser, the heat transferring characteristics of the DBR region are intentionally reduced. As a result, stable oscillation characteristics and wavelength variable characteristics are realized, and a module light source capable of realizing high-efficiency optical coupling is further provided. In other words,when the DBR semiconductor laser considered to be essential in a shortwave-length light source or in optical communication is mounted in a junction-down manner, the present invention realizes stable wavelength variable characteristics and highly reliable laser oscillation characteristics, leading to the significant practical advantages.

In Example 8 and the subsequent examples of the present invention, structures intended to enhance the productivity when a semiconductor laser chip is mounted on a submount will be described.

Examples for a semiconductor laser chip which can be used in the following examples include a DBR semiconductor laser including an active layer region and a DBR region, a distributed feedback (hereinafter, referred to as "DFB") type InP semiconductor laser, and the like. Examples for an optical waveguide element to be used include a wavelength converting device which converts a laser beam output from an optical fiber or a semiconductor laser chip into light having a wavelength which is equal to a half of the oscillation wavelength, and the like. Examples for a solder include Au/Sn, Pb/Sn, and the like, and examples for an adhesive include an adhesive containing UV curable agent (hereinafter, referred to as "UV curable type adhesive"), and the like. Examples for intermolecular force include van der Waal's force, and the like.

EXAMPLE 8

Figure 10:
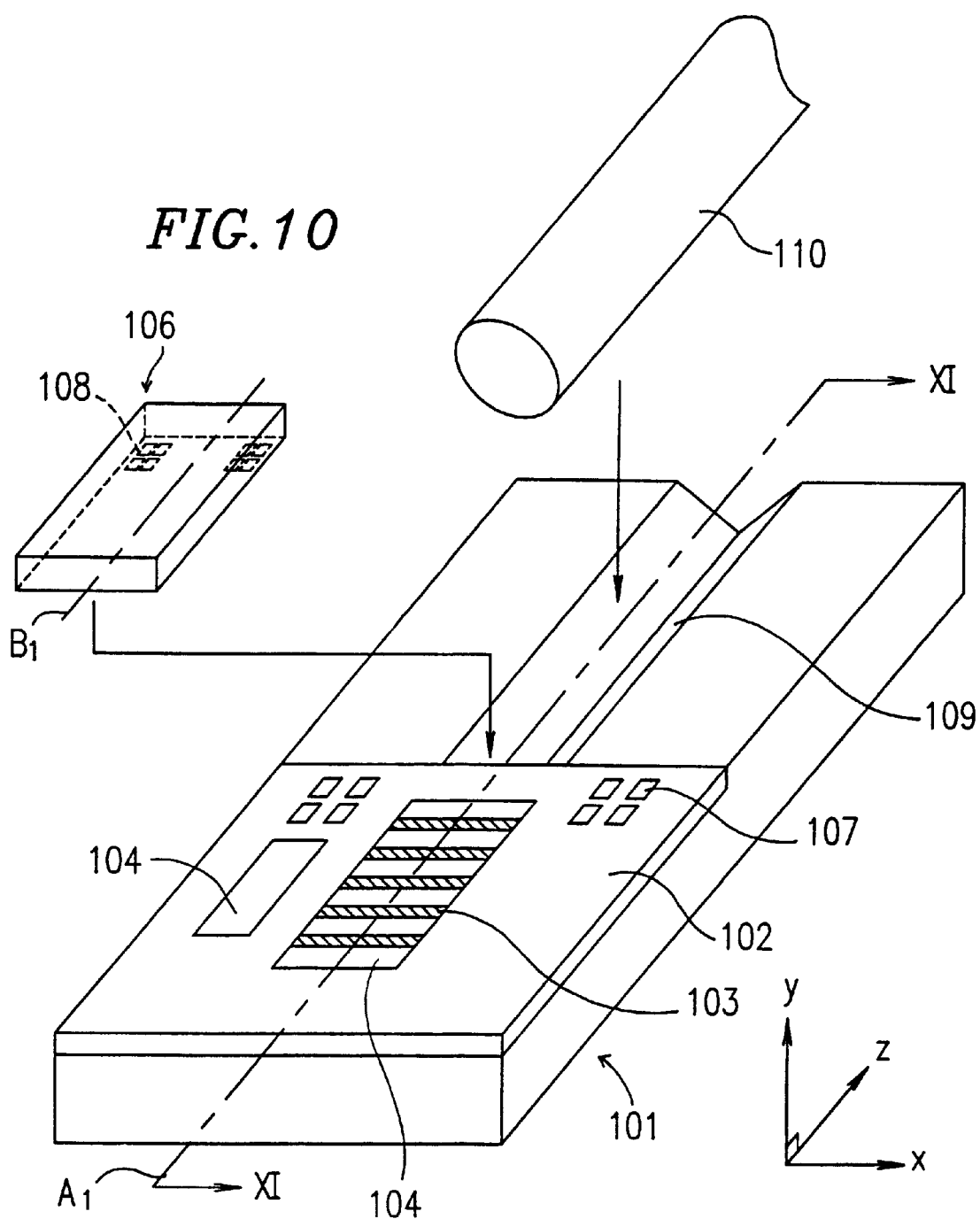
FIG. 10 is a perspective view schematically showing the structure of an optical integrated device according to Example 8 of the present invention.

According to the structure of an optical integrated device of the present example schematically shown in FIG. 10, grooves 103 are formed in an area of the surface of a submount 101 to which a semiconductor laser chip 106 is fixed, and solder is provided inside the grooves 103. The semiconductor laser chip 106 is closely fixed to the submount 101 using the solder provided inside the grooves 103.

The submount 101 made of silicon (Si) includes a $SiO_2$ layer 102 provided on the surface thereof as an insulation layer. The grooves 103 of the present invention are formed on the $SiO_2$ layer 102 of the submount 101. The semiconductor laser chip 106 is mounted on the $SiO_2$ layer 102. According to Example 8 of the present invention, a DFB type InP semiconductor laser of a 1.55 μm band is used as the semiconductor laser chip 106. Moreover, cross-shaped keys 107 and 108 for image recognition are provided on the surface of the submount 101 and the surface of the semiconductor laser chip 106, respectively. An optical fiber 110 as an optical waveguide element is mounted on a V-shaped groove 109 formed on the submount 101. A laser beam from the semiconductor laser chip 106 is coupled with the optical fiber 110.

Figure 11:
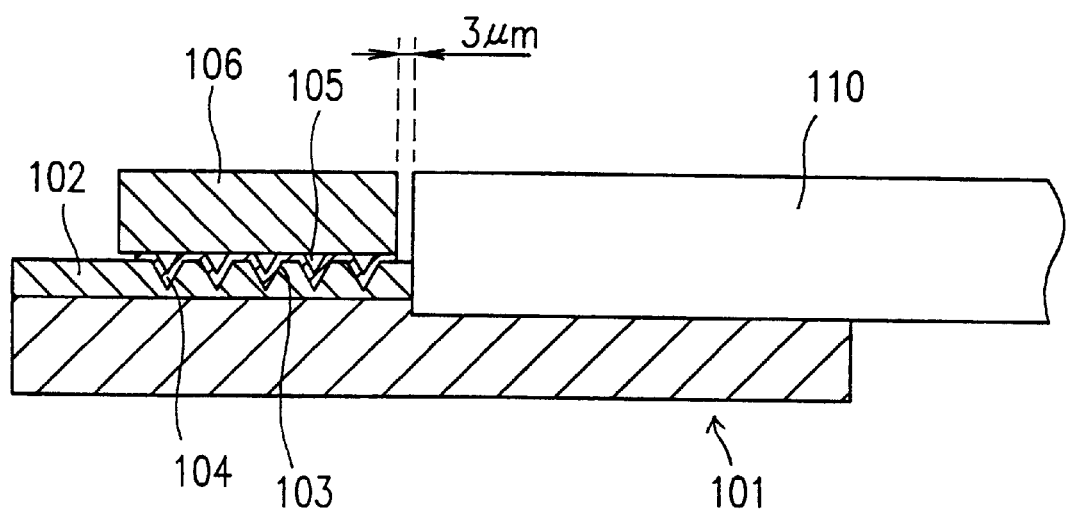
FIG. 11 is a cross-sectional view showing the optical integrated device along line XI—XI in FIG. 10.

FIG. 11 is a cross-sectional view showing the optical integrated device along line XI—XI of FIG. 10 including a center line A1 between the cross-shaped keys 107. FIG. 11 shows the state where the semiconductor laser chip 106 and the optical fiber 110 are mounted on the submount 101.

As shown in FIG. 11, an Au layer 104 is formed on the grooves 103 provided on the $SiO_2$ layer 102 as an electrode. The solder 105 is provided inside the grooves 103. The solder 105 may be made of Au/Sn.

According to the conventional technique, an Au layer is generally formed on a submount as an electrode, and a Au/Sn layer is deposited thereon as a solder layer. A thickness of the solder layer is in the range of about 2 μm to about 3 μm. The semiconductor laser chip is disposed so that the junction (i.e., the active layer portion) thereof is positioned closer to the submount side. By heating the submount so as to melt the solder, the semiconductor laser chip is fixed onto the submount.

The thickness from the surface of the semiconductor laser chip to the active layer is accurately controlled upon epitaxial growth. The thickness of the Au layer on the submount is also controlled in an accurate manner. Therefore, the height of the active layer from the submount mainly depends on the controllability for the thickness of the solder layer. However, since the solder layer is melted so as to fix the semiconductor laser chip, the actual controllability thereof is only about ±1 μm. As a result, the height of the light-emitting point of the semiconductor laser chip from the submount varies, and consequently, it is difficult to fix the semiconductor laser onto the submount in a highly accurate manner in the conventional technique.

According to the structure of the present example, on the other hand, as shown in FIG. 11, the grooves 103 are provided on the surface of the submount 101 and the solder 105 exists inside the grooves 103. Thus, the surface of the semiconductor laser chip 106 and the Au layer 104 of the submount 101 are in direct contact with each other. Accordingly, the height from the submount 101 to the active layer of the semiconductor laser chip 106 depends solely on the accuracy for the thickness of the Au layer 104, resulting in a highly accurate positioning in a height direction being performed.

Next, a method for forming the submount 101 according to the present example will be described.

First, the $SiO_2$ layer 102 is formed on the surface of the submount 101 made of a Si (100) substrate as an insulation layer by means of oxidation.

Next, resist is applied to the submount 101, and a periodic resist pattern with a width of about 10 μm and an interval of about 20 μm, and a resist pattern for the V-shaped groove with a width of about 100 μm, are formed by photo-process. Thereafter, the grooves 103 each having a depth of about 5 μm are formed on the submount 101 by wet etching. Since wet etching for the surface of the (100) substrate exposes (111) surface, the grooves in trapezoidal shapes (the V-shaped groove portions have triangular shapes) are formed. Alternatively, a groove in a rhomboid shape may be formed by dry etching.

Next, after removing the resist, resist pattern for the cross-shaped keys 107 for alignment and resist pattern for the electrodes are formed. Thereafter, the Au layer 104 is deposited. Next, in order to deposit the solder (Au/Sn) only inside the grooves 103, the resists are again removed. The same mask as that used when the grooves 103 are formed is aligned, and then the same resist pattern as that used when the grooves 103 are formed is used. Using the thus-formed resist pattern, the solder (Au/Sn) is deposited. Accordingly, the solder 105 is formed inside the grooves 103.

The cross-shaped keys 108 are formed on the surface of the semiconductor laser chip 106. The cross-shaped keys 107 on the surface of the submount 101 are formed at positions symmetric about the center line A1 in the V-shaped groove 109. The cross-shaped keys 108 on the surface of the semiconductor laser chip 106 are formed at positions symmetric about the light-emitting point (positioned on the center line B1) of the semiconductor laser chip 106.

According to the present example, a width of each of the grooves 103 formed on the submount 101 and a space therebetween (i.e., a distance between two adjacent grooves 103) are equally set to be 10 μm. However, considering the heat transferring characteristics of the semiconductor laser chip 106, the improved effect of heat transfer into the submount 101 is obtained when the area of each groove 103 (or the area of the solder (i.e., Au/Sn) 105 formed inside the groove 103) is made larger, thereby being more advantageous in improving the lifetime and reliability of the semiconductor laser chip 106.

Next, a positioning adjustment (alignment) method in the structure of the present example will be described with reference to FIG. 12.

Figure 12:
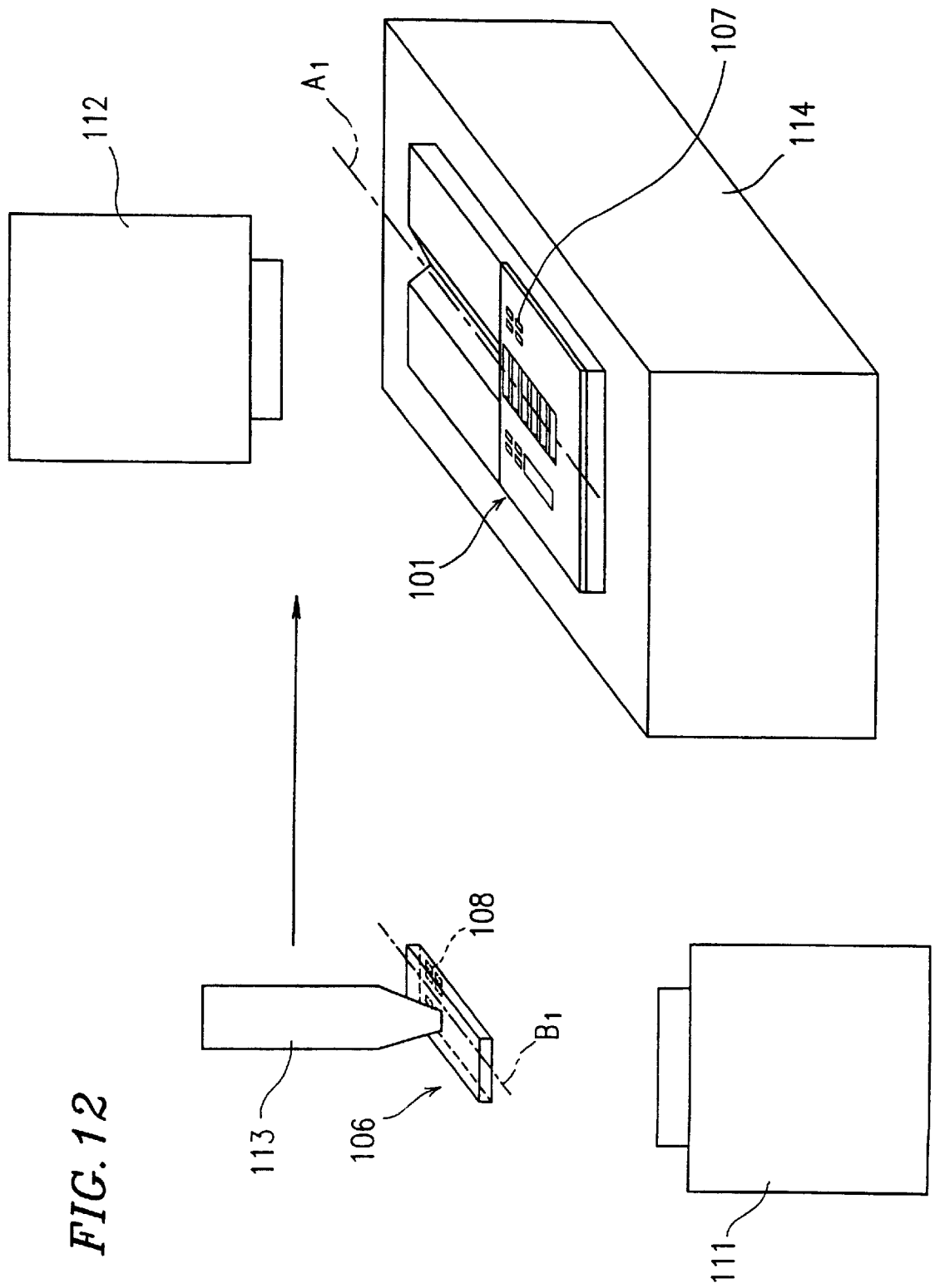
FIG. 12 is a view for schematically describing a mounting method of the optical integrated device in FIG. 11.

As shown in FIG. 12, the semiconductor laser chip 106 is fixed in a junction-down manner so that the active layer-side surface (i.e., an epitaxial growth surface) is positioned facing the submount. According to Example 8 of the present invention, the images of the cross-shaped keys 108 and 107 respectively provided on the semiconductor laser chip 106 and the submount 101 are recognized by respective cameras 111 and 112 so as to detect the respective center lines B1 and A1. Then, the semiconductor laser chip 106 is moved by a precision stage to a position where these center lines A1 and B1 coincide with each other, and then mounted there.

The semiconductor laser chip 106 is fixed to a tool 113 by a vacuum sweeper, and the submount 101 is fixed to the a stand 114 having a pulse heater. The camera 111 recognizes the images of the cross-shaped keys 108 formed on the semiconductor laser chip 106, and the camera 112 recognizes the images of the cross-shaped keys 107 formed on the submount 101. Consequently, the center line A1 between the cross-shaped keys 107 and the center line B1 between the cross-shaped keys 108 are respectively detected. Thereafter, the semiconductor laser chip 106 is moved by the precision stage so that the center lines A1 and B1 coincide with each other.

Next, the image of the outputting end surface of the semiconductor laser chip 106 is recognized by the camera 112, and the electrode thereof is adjusted so as to coincide with the pattern of the cross-shaped keys 107 formed on the submount 101. Once the fixation position is determined, the submount 101 is pulse-heated so as to melt the solder 105, thereby fixing the semiconductor laser chip 106. Accordingly, as shown in FIG. 12, the semiconductor laser chip 106 is mounted in close contact with the Au layer 104 of the submount 101.

By making the volume of the solder 105 after the fixation process to be smaller than that of the grooves 103, a closer contact is realized upon mounting, leading to the significant practical advantages.

After fixing the semiconductor laser chip 106, as shown in FIGS. 10 and 11, the optical fiber 110 is mounted on the V-shaped groove 109 as an optical waveguide element. At this time, a distance between the end surface of the optical fiber 110 and the outputting end surface of the semiconductor laser chip 106 is determined by a distance between the submount 101 and the electrode. According to Example 8 of the present invention, the height from the submount 101 to the light-emitting point of the semiconductor laser 106 is accurately controlled, and thus, the coupling efficiency depends on the processing accuracy for the V-shaped groove 109 of the submount 101. Specifically, since the V-shaped groove 109 is accurately processed by etching, it is possible to stably obtain the value of 30% as an efficiency in coupling with the optical fiber 110.

According to the present example, as shown in FIG. 11, since the surface of the semiconductor laser chip 106 is in close contact with the Au layer 104 on the submount 101, the height from the submount to the active layer depends on the accuracy for the thickness of the Au layer 104. Therefore, it is possible to perform mounting in a highly accurate manner. In an actual situation, however, since clearance grooves for the solder (Au/Sn) 105 in the grooves 103 are not provided, there is a possibility that the positioning accuracy in a height direction is adversely affected when an excessive amount of the solder 105 is provided. Therefore, it is required that the supply amount of the solder 105 is set to be equal to or less than the volume of the grooves 103.

Figure 25:
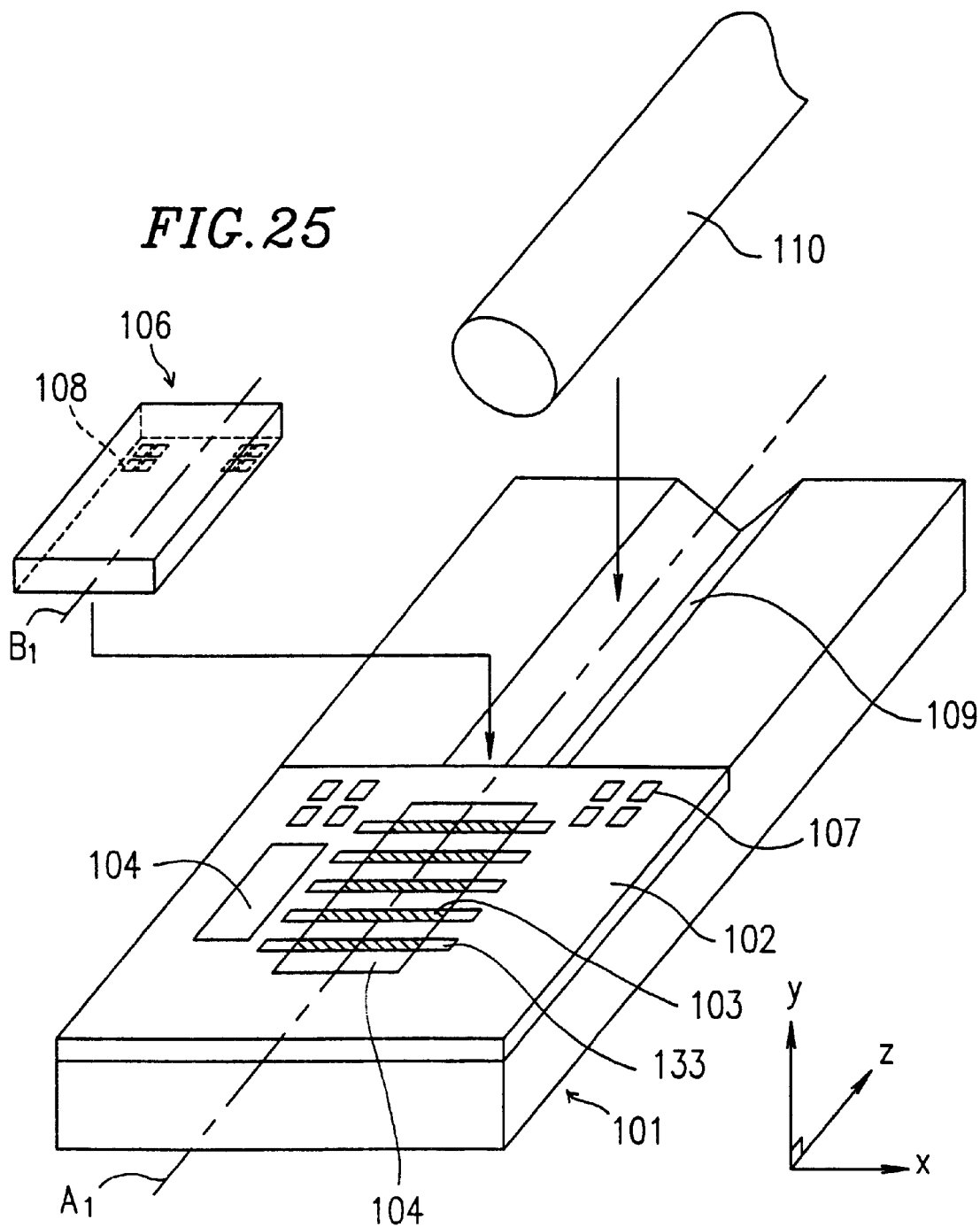
FIG. 25 is a perspective view schematically showing another structure of the optical integrated device according to Example 8 of the present invention.

On the other hand, FIG. 25 shows a modified example for the structure shown in FIG. 10. In this modified version, clearance grooves 133 are provided adjacent to each of the grooves 103. Therefore, even if the solder 105 is excessively provided, the excess amount of the solder 105 is pushed out into the clearance groove 133 at the time of mounting. Therefore, the degree of contact between the semiconductor laser chip 106 and the submount 101 is improved, and adverse effect on the positioning accuracy in a height direction due to the excess solder can be avoided. In FIG. 25, the same components as those in FIG. 10 are denoted by the same reference numerals, and therefore, the description thereof is herein omitted.

Hereinafter, a method for forming the structure of FIG. 25 will be described.

First, a SiO₂ layer 102 is formed on the surface of a submount 101 made of Si (100) substrate as an insulation layer by means of oxidation.

Next, resist is applied to the submount 101, and a predetermined resist pattern is simultaneously formed by photo-process. Thereafter, grooves 103 each having a width of about 5 μm and clearance grooves 133 are simultaneously formed on the submount 101.

After removing the resist, resist patterns for cross-shaped keys 107 for adjustment (alignment) and an electrode are formed again by the photo-process. Subsequently, an Au layer 104 is deposited. Next, in order to deposit solder (Au/Sn) only inside the grooves 103, the resists are removed again. A mask different from that used when the grooves 103 were formed is positioned, and a resist pattern different from that used when the grooves 103 were formed is formed. Using the thus-formed resist pattern, the solder (Au/Sn) is deposited. At this point, the solder 105 is not deposited on the entire grooves 103. Rather, the solder 105 is deposited in regions to which the semiconductor laser chip 106 is fixed. Accordingly, the clearance grooves 133 are formed at both sides of the solder 105, thereby enhancing the degree of contact between the semiconductor laser chip 106 and the submount 101 at the time of mounting.

With the structure as described above, it is possible to readily realize positioning adjustment (alignment) accuracy in the order of a submicron or less which is required to couple a laser beam from the semiconductor laser chip 106 with the optical fiber 110 or the optical waveguide at a high efficiency. Thus, highly practical optical integrated device is provided.

In the above-described example, the case where the optical fiber 110 is used as an optical waveguide element is described. However, it is possible to use a wavelength converting device which converts a laser beam output from the semiconductor laser chip 106 to light with a wavelength equal to a half of the wavelength of the laser beam. Moreover, as the semiconductor laser chip 106, the DBR semiconductor laser chip structured by an active layer region and a DBR region may be used.

For example, it is possible to use a 100 mW class DBR type AlGaAs semiconductor laser which oscillates in a TE mode (the oscillation wavelength thereof is 850 nm) as a semiconductor laser chip, and to use an optical waveguide type wavelength converting device in which a proton exchange optical waveguide and periodic domain-inverted regions are formed on an x-cut MgO-doped LiNbO$_3$ substrate as an optical waveguide element. With such a structure, since the optical waveguide fabricated on the x-cut substrate is capable of waveguiding light in a TE mode only, planar type direct coupling can be realized.

In the description above, the grooves 103 are provided in a direction perpendicular to the light-emitting region of the semiconductor laser chip 106. Hereinafter, a structure using a submount 115 in which grooves 117 are formed in a direction parallel to the light-emitting region of a semiconductor laser chip 120 will be described with reference to FIGS. 13 and 14.

Figure 13:
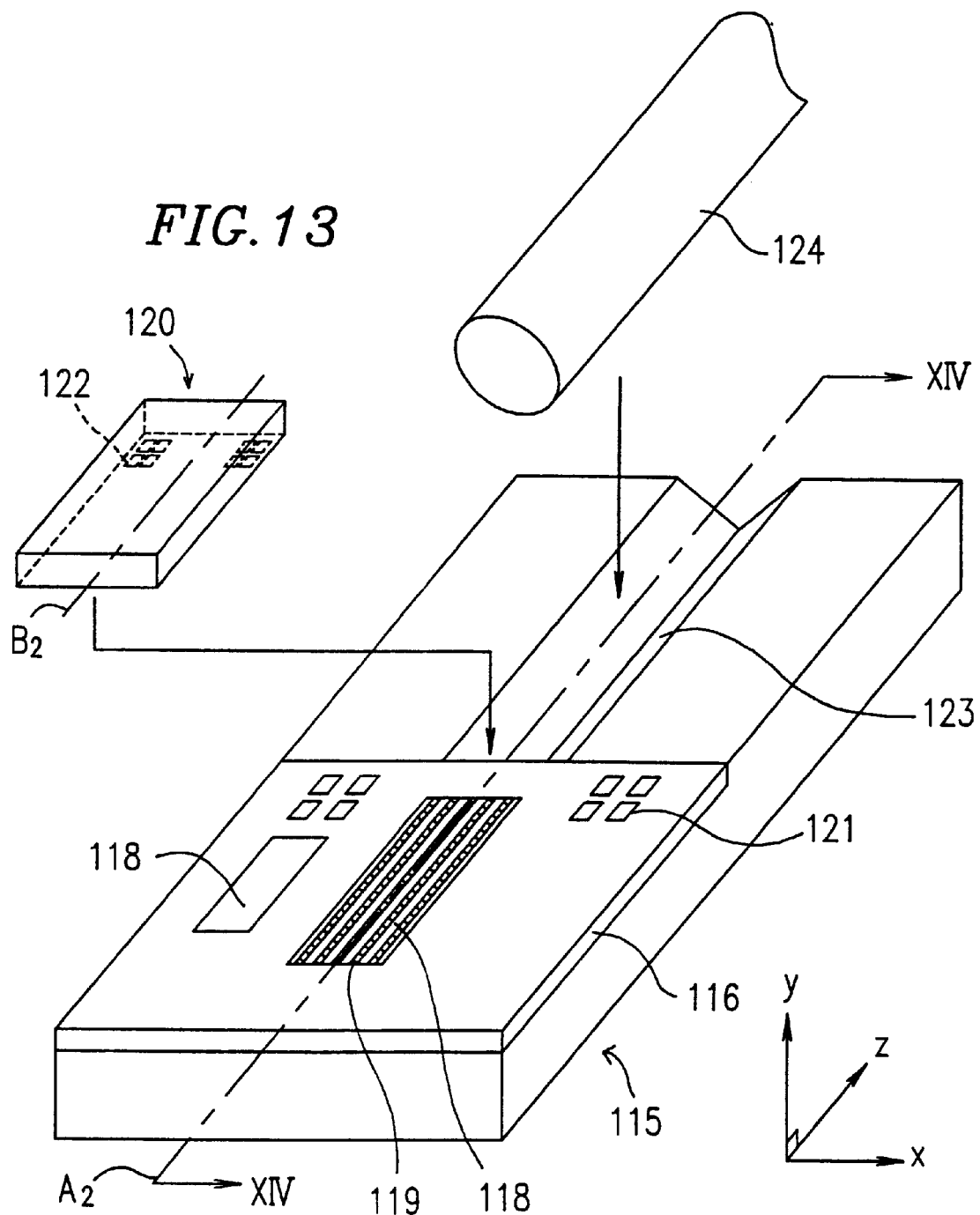
FIG. 13 is a perspective view schematically showing another structure for the optical integrated device according to Example 8 of the present invention.

In the structure of the optical integrated device schematically shown in FIG. 13, a SiO$_2$ layer 116 is also provided on the surface of the submount 115 made of silicon (Si) as an insulation layer. The grooves 117 are formed on the SiO$_2$ layer on the submount 115. The semiconductor laser chip 120 is mounted on the SiO$_2$ layer 116. Cross-shaped keys 121 and 122 for image recognition are formed on the surface of the submount 115 and the surface of the semiconductor laser chip 120, respectively. An optical fiber 124 is mounted on a V-shaped groove 123 formed on the submount 115 as an optical waveguide element. A laser beam from the semiconductor laser chip 120 is coupled with the optical fiber 124.

Figure 14:
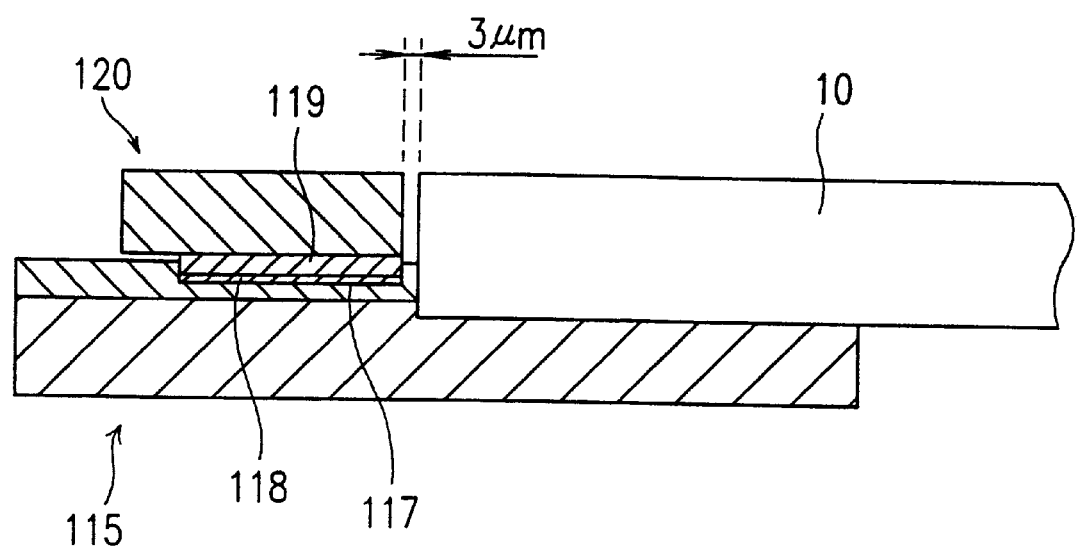
FIG. 14 is a cross-sectional view showing the optical integrated device along line XIV—XIV in FIG. 13.

FIG. 14 is a cross-sectional view showing the optical integrated device along line XIV—XIV of FIG. 13 including a center line A2 between the cross-shaped keys 121. FIG. 14 shows the state where the semiconductor laser chip 120 and the optical fiber 124 are mounted on the submount 115. As shown in FIG. 14, an Au layer 118 is formed on the grooves 117 provided on the SiO$_2$ layer 116 as an electrode. The solder 119 (Au/Sn) is provided inside the grooves 103.

Upon mounting, the images of the cross-shaped keys 121 and 122 are recognized so as to detect the respective center lines A2 and B2. The semiconductor laser chip 120 is mounted on the submount 115 so that these center lines A2 and B2 coincide with each other. At this time, in the structure shown in FIG. 10 in which the direction of the active layer of the semiconductor laser and the direction of the formation of the grooves in the submount are perpendicular with each other, and regions where the active layer is fixed to the submount via solder exist in a periodic manner along a direction of the optical axis of the semiconductor laser, there exists a possibility that heat distribution generated at the time of operation occurs in a periodic manner along the optical direction. According to the structure shown in FIG. 13, however, the heat transfer from the semiconductor laser chip 120 occurs uniformly, which advantageously leads to improved reliability.

EXAMPLE 9

According to the structure of an optical integrated device of Example 9 schematically shown in Figure in addition to the grooves provided in a region where the semiconductor laser chip 203 is fixed, grooves 202 are further provided in a region of the surface of a submount 201 where a planar type optical waveguide element 204 is fixed, and solder is provided inside the grooves 202. The planar type optical waveguide element 204 and the semiconductor laser chip 203 are closely fixed to the submount 201 using the solder provided inside these grooves.

The optical waveguide of the planar type optical waveguide element 204 may be an optical waveguide fabricated on a dielectric substrate or ferroelectric substrate by using an ion exchange method such as proton exchange, a diffusion method such as Ti diffusion, or the like. Since such an optical waveguide can be produced using a wafer by a semiconductor process, productivity thereof is high.

Figure 15:
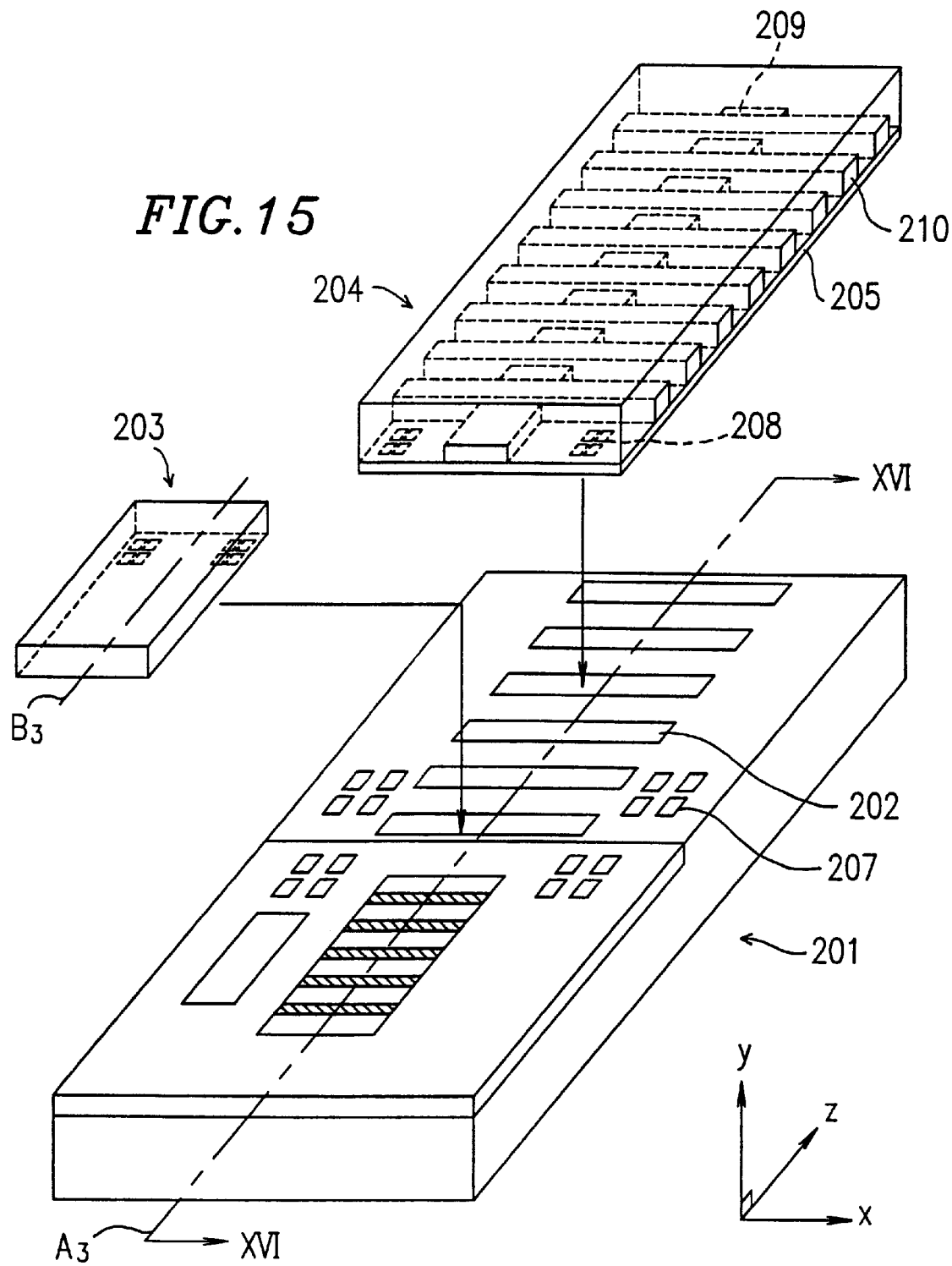
FIG. 15 is a perspective view schematically showing the structure of an optical integrated device according to Example 9 of the present invention.

In the structure of FIG. 15, the semiconductor laser chip 203 is mounted on the submount 201 in a junction-down manner using the same method as that in Example 8. The submount 201 is made of silicon (Si).

The optical waveguide type wavelength converting device 204 in which a proton exchange optical waveguide 10 209 and periodic domain-inverted regions 210 are provided on an x-cut MgO-doped LiNbO$_3$ substrate may be used as the planar type optical waveguide device. As the semiconductor laser chip 203, a 100 mW class DBR type AlGaAs semiconductor laser which oscillates in a TE mode (the oscillation wavelength thereof is 850 nm) may be used. Since the optical waveguide fabricated on the x-cut substrate is capable of waveguiding light in a TE mode only, planar type direct coupling can be realized according to such a structure. On the other hand, in the case where the optical waveguide fabricated on a z-cut substrate is used, a half-wavelength plate is required in order to make polarization directions coincided with each other. Therefore, coupling efficiency is reduced at the time of direct coupling.

A protecting film 205 is provided on the surface of the optical waveguide type wavelength converting device 204 for the positioning adjustment (alignment) in a thickness direction (i.e., y-direction). The protecting film 205 is formed of, for example, a SiO$_2$ sputtering film, and a thickness thereof is accurately controlled.

Figure 16:
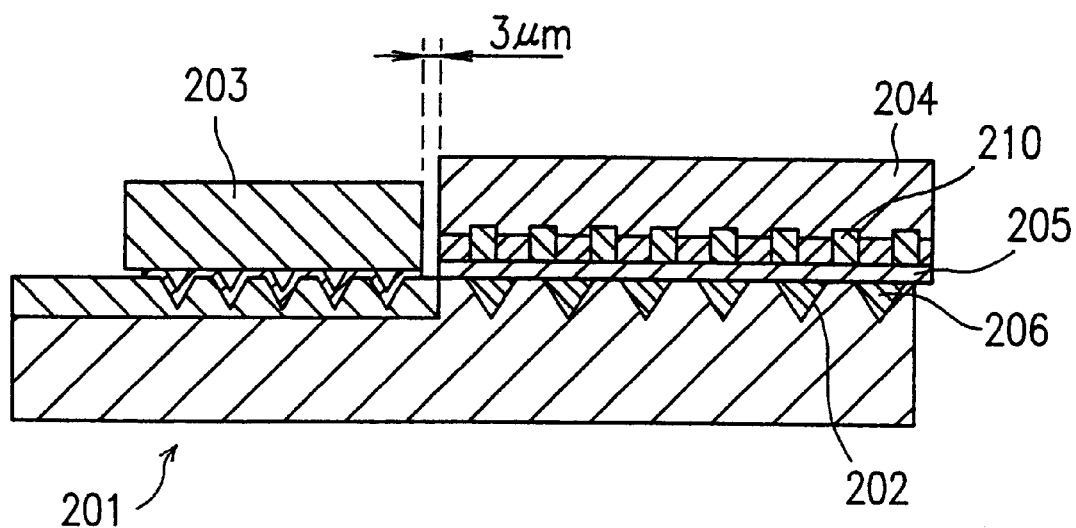
FIG. 16 is a cross-sectional view showing the optical integrated device along line XVI—XVI in FIG. 15.

FIG. 16 is a cross-sectional view showing the optical integrated device along line XVI—XVI line of FIG. 15 including a center line A3 between the cross-shaped keys 207. FIG. 16 shows the state where the semiconductor laser chip 203 and the optical waveguide type wavelength converting device 204 are mounted on the submount 201.

As shown in FIG. 16, adhesive 206 for fixation is injected into the grooves 202. According to the present example, UV curable type adhesive, for example, is used as the adhesive 206. The UV curable type adhesive can be easily injected into the grooves 202 because of its small viscosity, resulting in significant practical advantages.

In the structure having no clearance grooves as shown in FIG. 15, it is preferable that the volume of the cured adhesive 206 is smaller than the volume of the grooves 202 in order to enhance the degree of contact. Alternatively, as described in Example 8 with reference to FIG. 25, by providing clearance grooves adjacent to each of the grooves 202, the excess amount of the adhesive is flowed into the clearance groove at the time of mounting. Therefore, without adversely influencing the positioning accuracy, the degree of contact between the planar type optical waveguide element 204 and the submount 101 is improved.

As shown in FIG. 15, cross-shaped keys 207 and 208 for mounting the wavelength converting device 204 are formed on the surface of the submount 201 and the surface of the optical waveguide type wavelength converting device 204 in the same manner as that in the cross-shaped keys for mounting the semiconductor laser chip. A center line A3 between the cross-shaped keys 207 coincides with a center line B3 between the cross-shaped keys for fixing the semiconductor laser chip.

Upon mounting, the optical waveguide type wavelength converting device 204 is moved so that the center line of the cross-shaped keys 208 on the optical waveguide type wavelength converting device 204 and that of the cross-shaped keys 207 on the Si submount 201 coincide with each other, and a distance between the outputting surface of the semiconductor laser chip 203 and the inputting surface of the optical waveguide type wavelength converting device 204 is about 3 $\mu$m (see FIG. 16). Thereafter, the optical waveguide type wavelength converting device 204 is irradiated with UV light so as to fix the adhesive 206 while being applied with a constant amount of pressure.

According to the module structure of the present invention, since the adhesive 206 exists inside the grooves 202, the protecting layer 205 is in close contact with the submount 202. Thus, it is possible to perform positioning adjustment (alignment) in a thickness direction based on the thickness accuracy of the protecting layer 205. Therefore, it is possible to realize a coupling efficiency of 70% with a high yield.

Specifically, by changing the current injected into the DBR region of the DBR semiconductor laser chip 203 so as to vary an oscillation wavelength such that the oscillation wavelength of the semiconductor laser 203 coincides with the phase matching wavelength of the optical waveguide type wavelength converting device 204, a blue light output of about 10 mW at a wavelength of 425 nm can be obtained from the wavelength converting device 204.

In the case where the optical waveguide type wavelength converting device is fixed onto a submount having no grooves 202 by adhesive (i.e., UV curable type adhesive), a thickness of the adhesive layer between the optical waveguide element and the submount greatly influences the positioning adjustment (alignment) accuracy in a y-direction. Moreover, shrinkage of the adhesive, which generally occurs when the adhesive is cured, further deteriorates the positioning adjustment accuracy. Due to the factors described above, according to the conventional technique, it is difficult to fix the optical waveguide type wavelength converting device on the submount at the adjustment accuracy in the order of a submicron or less. According to the structure of the present example, on the other hand, since no adhesive layer exists between the planar type optical waveguide element and the submount, a distance between the optical waveguide and the submount is determined depending on the thickness of the protecting layer 205. Accordingly, highly accurate positioning (alignment) becomes possible, thereby realizing optical coupling at a high efficiency.

Although the UV curable type adhesive is used as adhesive in the present example, the similar effects can be obtained by using other adhesive. In particular, by using adhesive which shrinks after bonding, the degree of contact with respect to the submount is further enhanced, resulting in more satisfactory advantages.

The optical waveguide fabricated on a dielectric substrate or ferroelectric substrate by using an ion exchange method such as proton exchange, a diffusion method such as Ti diffusion, or the like, generally has a depth of about 2 $\mu$m. Therefore, as compared to the case of the optical integrated device using the optical fiber, more accurate adjustment is required. Thus, if accuracy for the positioning adjustment (alignment) in a thickness direction of the substrate can be improved by forming the grooves on the submount as in the present example, the practical effect thereof is significant. Specifically, the present invention exhibits a great practical effect, for example, for the short-wavelength blue light source structured by the DBR semiconductor laser and the optical waveguide type wavelength converting device having periodic domain-inverted regions on the $LiNbO_3$ substrate or $LiTaO_3$ substrate.

According to the aforementioned description, the grooves 202 are formed in a direction perpendicular to the direction of the optical waveguide 209 of the planar type optical waveguide device 204. However, in order to realize uniform heat transferring condition, it is preferable that the grooves 202 are formed in a direction parallel to the optical waveguide 209 in the manner similar to the case described in Example 8 with reference to FIGS. 13 and 14. In particular, since temperature distribution inside the optical waveguide type wavelength converting device greatly influences device characteristics such as a wavelength converting efficiency, significant effect can be obtained by realizing uniform temperature distribution by forming the grooves in a direction parallel to the optical waveguide.

EXAMPLE 10

In Example 9 of the present invention, device structure which realizes highly accurate mounting by forming the grooves on the submount when the planar type optical waveguide element (i.e., the optical waveguide type wavelength converting device) is fixed by adhesive (i.e., UV curable type adhesive) was described. According to the present example, the structure such that a planar type optical waveguide element (i.e., an optical waveguide type wavelength converting device) is fixed onto a submount by means of molecular binding force without using adhesive such as the UV curable type adhesive, and a method for producing the same, will be described with reference to FIGS. 17 and 18. In such a case, since no components exist between the planar type optical waveguide element and the submount, the same effects as those in Example 2 can be obtained.

Figure 17:
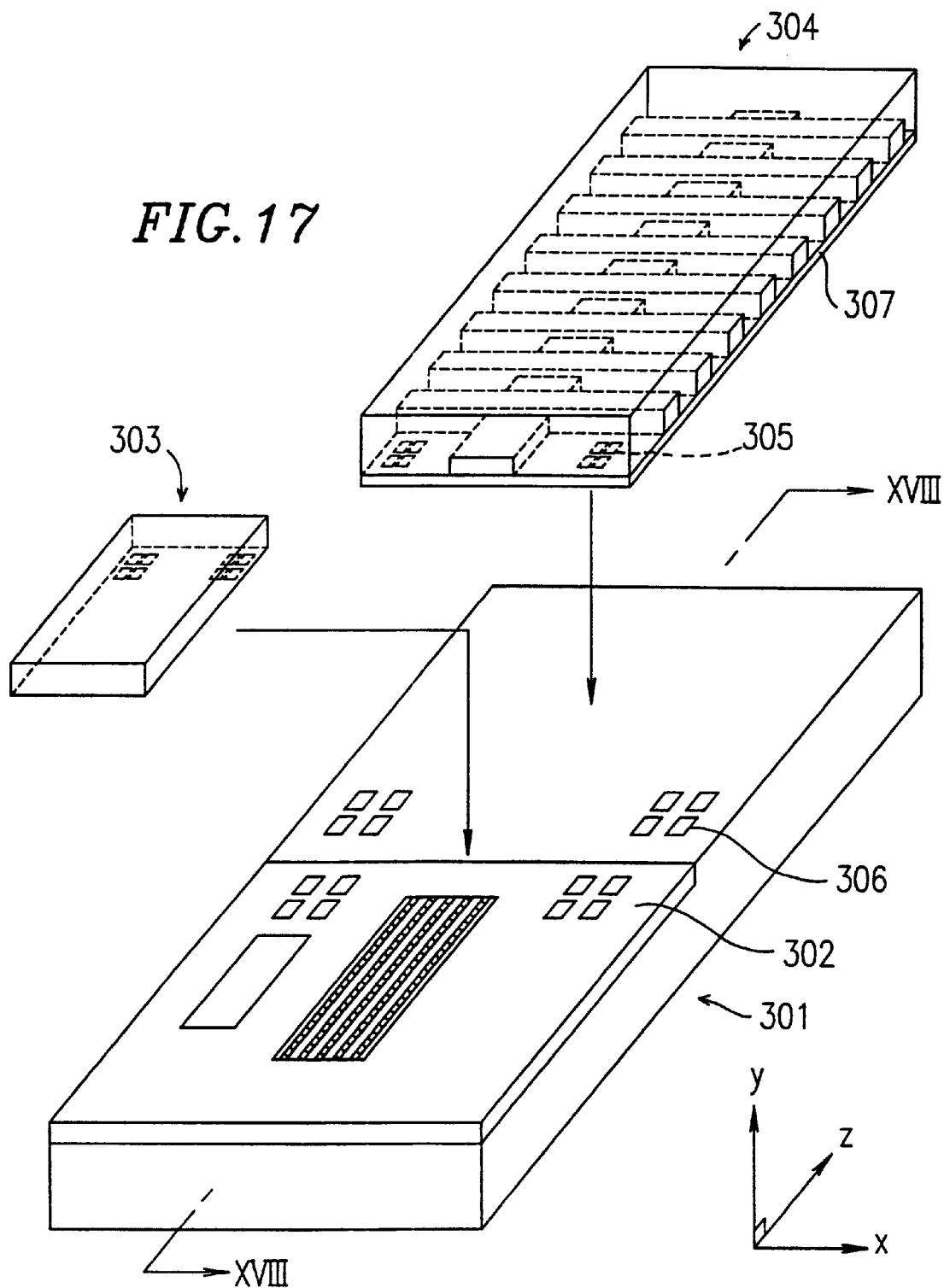
FIG. 17 is a perspective view schematically showing the structure of an optical integrated device according to Example 10 of the present invention.
Figure 18:
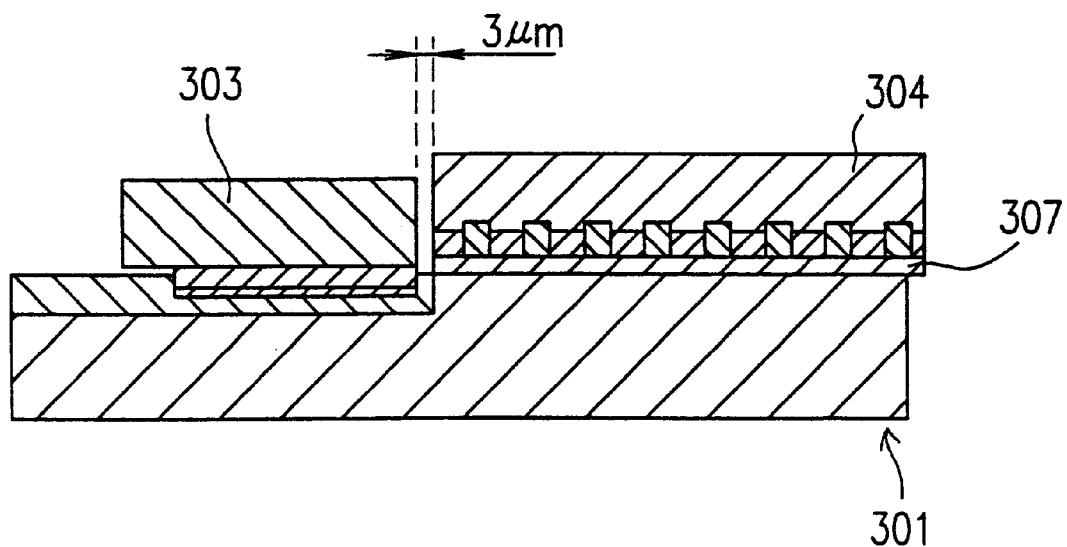
FIG. 18 is a cross-sectional view showing the optical integrated device along line XVIII—XVIII in FIG. 17.

FIG. 17 is a perspective view schematically showing the structure as described above. FIG. 18 is a cross-sectional view showing the device along line XVIII—XVIII of FIG. 17 including a center line (not shown) between the cross-shaped keys 306. FIG. 18 shows the state where the semiconductor laser chip 303 and an optical waveguide type wavelength converting device 304 are mounted on a submount 301.

In FIG. 17, it is preferable that the entire surface of the submount 301 made of silicon (Si) is oxidized, i.e., it is preferable that a $SiO_2$ layer 302 is formed on the entire surface of the submount 301. This is intended to enhance bonding characteristics with a MgO-doped $LiNbO_3$ substrate. An area to which a semiconductor laser chip 303 is fixed has a shape as described with reference to FIGS. 13 and 14, and an electrode and solder are deposited thereon. By using the same method as that in Example 8, the semiconductor laser chip 303 is mounted in a junction-down manner at a desired position on the submount 301 so that the active layer-side surface thereof comes closer to the submount 301. The semiconductor laser chip 303 is, for example, a 100 mW class DBR AlGaAs semiconductor laser which oscillates in a TE mode, and the oscillation wavelength thereof is 850 nm.

Next, a method for mounting a planar type optical waveguide element 304 on the submount 301 will be described.

As in Example 2 of the present invention, the optical waveguide type wavelength converting device 304, in which a proton exchange optical waveguide and periodic domain-inverted regions are provided on an x-cut MgO-doped $LiNbO_3$ substrate, is used as the planar type optical waveguide element 304. In such a case, the optical waveguide fabricated on the x-cut substrate is capable of waveguiding TE-mode light only. As a result, planar type direct coupling can be realized.

In order to perform positioning adjustment (alignment) in a y-direction, a protecting layer 307, for example, a $SiO_2$ sputtering film 307, is formed on the surface of the optical waveguide type wavelength converting device 304. The surface of the $SiO_2$ layer 302 on the submount 301 and the mounting surface of the optical waveguide type wavelength converting device 304 are sufficiently washed before mounting.

Upon mounting, the images of cross-shaped keys 305 and 306 are recognized so as to align center lines of these cross-shaped keys with each other. In addition, the positioning is adjusted so that a distance between the end surface of the semiconductor laser chip 303 and the end surface of the optical waveguide type wavelength converting device 304 is about 3 $\mu$m (see FIG. 18). At such a position, the optical waveguide type wavelength converting device 304 and the submount 301 are subjected to optical contact with each other, while the optical waveguide type wavelength converting device 304 is being applied with a constant amount of pressure. The optical waveguide type wavelength converting device 304 and the submount 301 are held in such a state at a temperature of about 300° C. and for about 30 minutes. By such a heating and holding step, the optical waveguide is simultaneously annealed under the aforementioned conditions, and therefore, the optical waveguide type wavelength converting device 304 used in the present example has been prepared taking the above into consideration.

In the present example, by conducting such an annealing step, it is possible to fix the optical waveguide type wavelength converting device 304 with the submount 301 without interposing some component therebetween. Consequently, the height of the optical waveguide of the optical waveguide type wavelength converting device 304 can be adjusted solely by the accuracy for the thickness of the protecting layer 307. Thus, highly accurate fixation can be realized.

Specifically, according to the structure of the present example, it is possible to realize a coupling efficiency of about 70% with a high yield. Moreover, by changing the current injected into the DBR region of the DBR semiconductor laser chip 303 so as to vary an oscillation wavelength such that the oscillation wavelength of the semiconductor laser 303 coincides with the phase matching wavelength of the optical waveguide type wavelength converting device 304, blue light with a wavelength of 425 nm can be obtained from the wavelength converting device 304 for the output of about 10 mW.

EXAMPLE 11

According to Example 11 of the present invention, the structure of a submount on which a semiconductor laser chip having two electrodes such as a DBR semiconductor laser is mounted utilizing a $SiO_2$ layer as an insulation layer will be described with reference to the cross-sectional view of FIG. 19.

Figure 19:
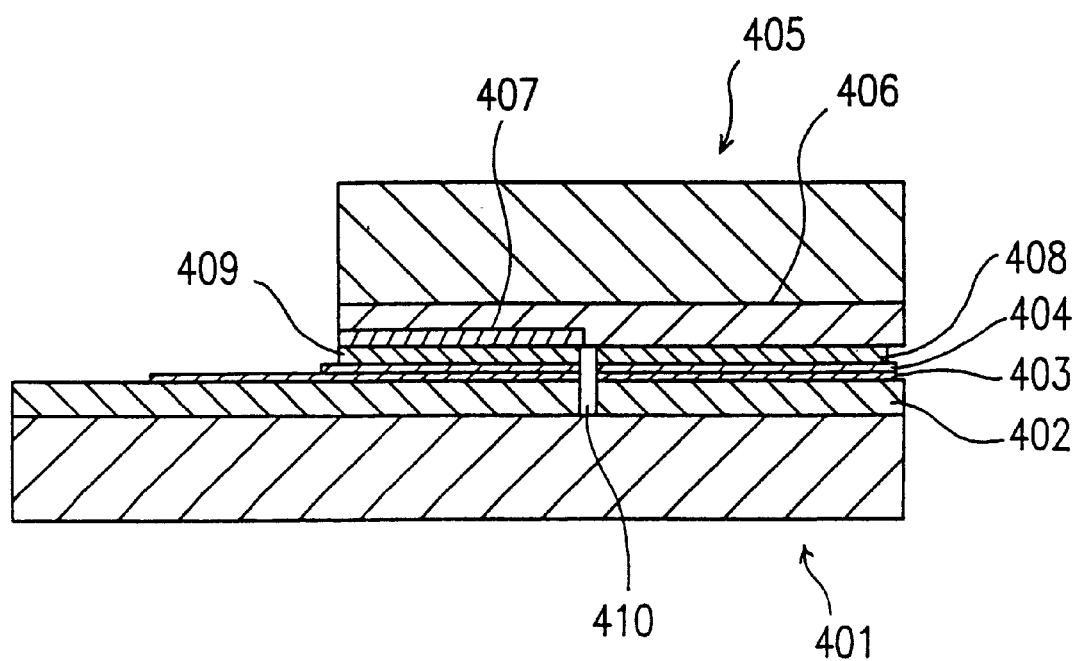
FIG. 19 is a cross-sectional view schematically showing the structure of an optical integrated device according to Example 11 of the present invention.

In FIG. 19, a submount 401 includes a $SiO_2$ layer 402 provided on the surface thereof as an insulation layer, and an AUi layer 403 and a solder (Au/Sn) layer 404 are deposited thereon. In order to divide these electrode layers into a predetermined regions, the $SiO_2$ layer 402, the Au layer 403, and the solder (Au/Sn) layer 404 are etched so as to form a groove 410. A semiconductor laser chip 405 includes an active region 406 for providing gain and a distributed Bragg region (i.e., DBR region) 407 for controlling an oscillation wavelength. Electrodes 408 and 409 are provided in the regions 406 and 407, respectively, in such a manner that they are electrically isolated from each other. By providing the groove 410 in the submount 401 as in the present example so as to isolate the region corresponding to the active region 406 of the DBR semiconductor laser chip 405 from the region corresponding to the DBR region 407, the current injected into the active region 406 and the current injected into the DBR region 407 can be completely separated from each other. Thus, stable operation can be realized.

The DBR semiconductor laser chip 405 is fixed onto the submount 401 in a junction-down manner so that the active layer-side surface thereof comes closer to the submount. In an AlGaAs type DBR semiconductor laser, a high resistance layer exists in the DBR region, so that a temperature in the high resistance layer is raised by the current injection, thereby changing a refractive index and leading to a change in the wavelength. In such a case, according to the junction-down mounting such that the active layer-side surface of the semiconductor laser chip is positioned closer to the submount, heat transferring characteristics from the DBR region to the submount are increased, which in turn deteriorates the wavelength variation characteristics. In order to prevent such an adverse effect, a groove with an appropriate shape is formed at a portion of the submount, to which the optical waveguide portion in the DBR region of the DBR semiconductor laser contacts, so as to intentionally deteriorate the heat transferring characteristics thereof. As a result, it is possible to suppress deterioration in the wavelength variation characteristics or to improve the wavelength variation characteristics.

The mounting structure for the DBR semiconductor laser chip 405 described in the present example can be applied when the semiconductor laser chip having two electrodes is used in the structure described in each of the aforementioned Examples 8 through 10 and each of the later-described Examples 12 to 14.

EXAMPLE 12

Figure 20:
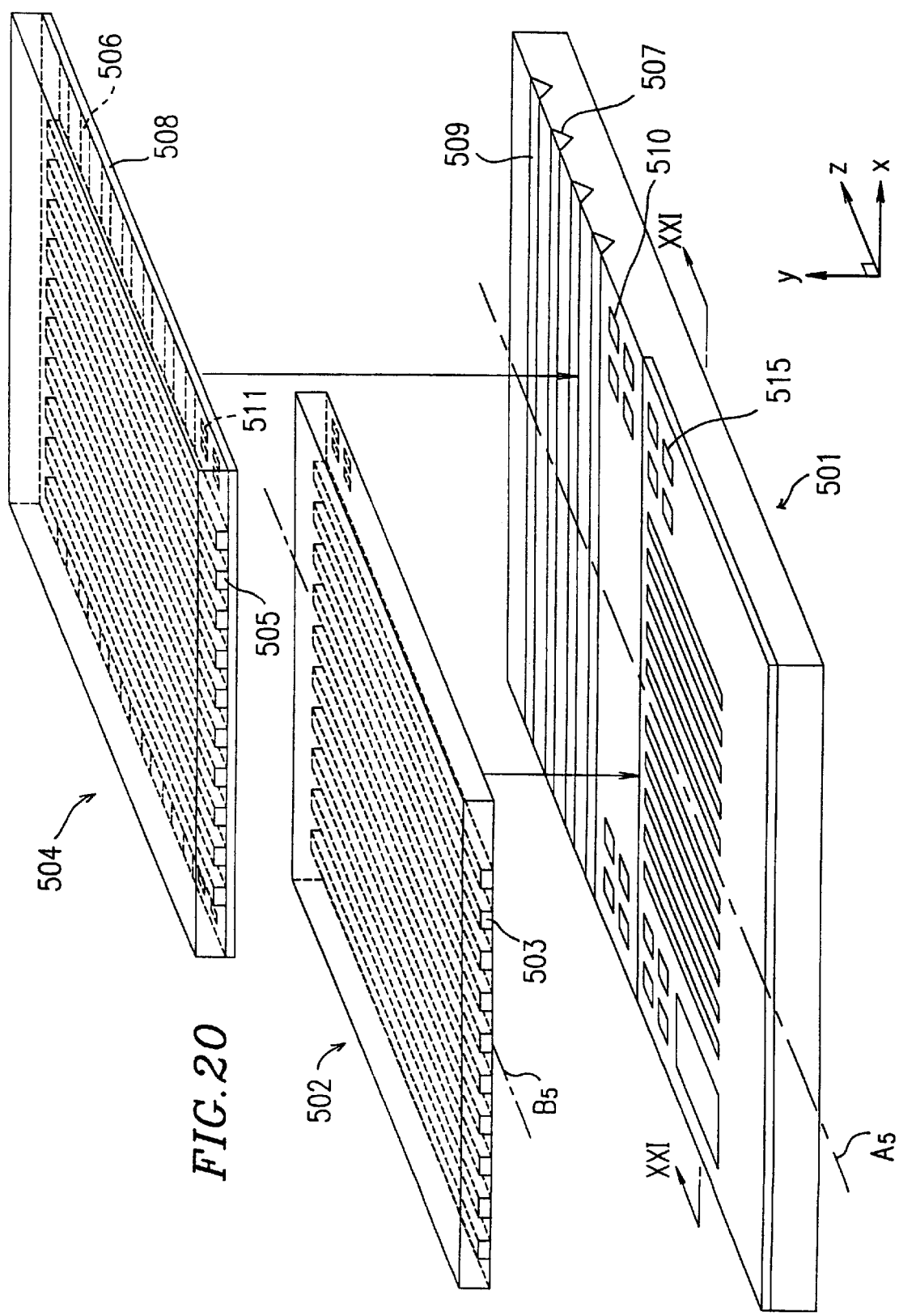
FIG. 20 is a perspective view schematically showing the structure of an optical integrated device according to Example 12 of the present invention.
Figure 21:
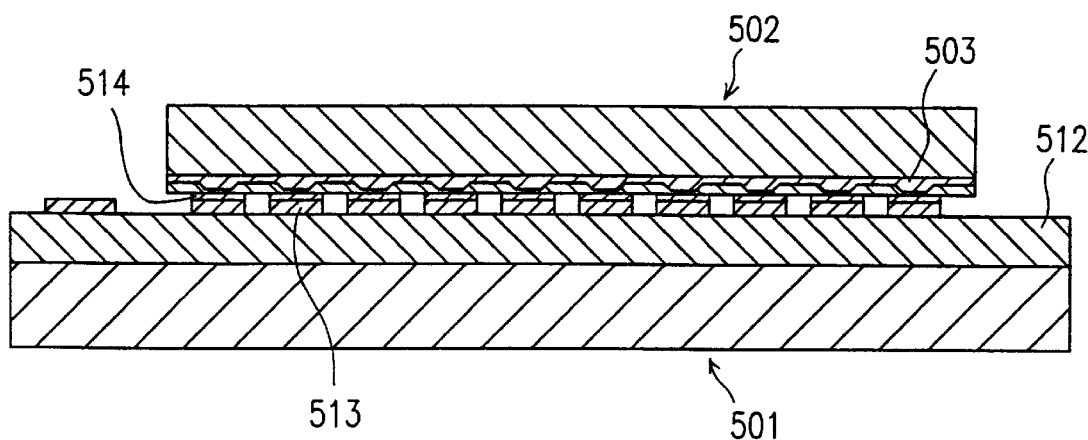
FIG. 21 is a cross-sectional view showing the optical integrated device along line XXI—XXI in FIG. 20.

In Example 12 of the present invention, a direct coupling type optical integrated device, in which an array type semiconductor laser chip having a plurality of light-emitting regions and a planar type optical waveguide element having a plurality of optical waveguides are mounted on a submount, will be described with reference to FIGS. 20 and 21. FIG. 20 is a perspective view schematically showing such a structure, and FIG. 21 is a cross-sectional view showing the optical integrated device cut along a line XXI—XXI of FIG. 20.

According to the structure of the present example, an array type DBR AlGaAs semiconductor laser chip of 100 mW class, having ten of light emitting regions 503, is used as a semiconductor laser chip. As a planar type optical waveguide element 504, the optical waveguide type wavelength converting device 504 in which ten of proton exchange optical waveguides 505 and periodic domain-inverted regions 506 are provided on an x-cut MgO-doped $LiNbO_3$ substrate is used.

In the structure of the present example, intervals between the light-emitting regions 503 of the array type semiconductor laser chip 502 are identical with intervals between the optical waveguides 505 of the optical waveguide type wavelength converting device 504. As a result, adjustment of optical coupling can be realized simultaneously for ten of the optical waveguides. Moreover, both of the intervals between the light-emitting regions 503 of the array type semiconductor laser chip 502 and the intervals between the optical waveguides 505 of the optical waveguide element 504 are preferably in the range of about 0.3 mm to about 1.0 mm.

As the array type semiconductor laser chip 502, the laser chip oscillating in a TE mode may be used. In such a case, the optical waveguide fabricated on the x-cut substrate is capable of waveguiding TE-mode light only and, therefore, the planar type direct coupling can be realized.

At both sides of the optical waveguide type wavelength converting device 504 and the semiconductor laser chip 502, cross-shaped keys 511 and 516 to be used for image recognition are provided, respectively. Moreover, cross-shaped keys 510 and 515 are provided on the submount 501. These cross-shaped keys are formed using the same mask. Positions where these cross-shaped keys are formed are adjusted so that the positional relationship between the light-emitting regions 503 on the array type semiconductor laser chip 502 and the cross-shaped keys 516 becomes identical with the positional relationship between the optical waveguides 505 on the optical waveguide type wavelength converting device 504 and the cross-shaped keys 511.

A protecting layer 508 for adjusting a thickness is formed on the surface of the optical waveguide type wavelength converting device 504. In the same manner as that in Example 9, the optical waveguide type wavelength converting device 504 is fixed onto a silicon (Si) submount 501 with grooves 507. As an adhesive, UV curable type adhesive 509 is injected into the grooves 507. Since the adhesive 509 is injected inside the grooves 507 formed on the submount 501, the positioning adjustment (alignment) in a thickness direction of the substrate (i.e., y-direction) can be easily performed by controlling the thickness of the protecting film 508 on the optical waveguide type wavelength converting device 504 in a highly accurate manner.

Referring to the cross-sectional view of FIG. 21, grooves as described in Example 8 are not provided in a region on the submount where the array type semiconductor laser chip 502 is mounted. In such a region, a $SiO_2$ layer 512 is formed as an insulation film, and Au layers 513 and solder (Au/Sn) layers 514 are further provided thereon in a predetermined electrode pattern such that the Au layers 513 are disposed under the light-emitting regions 503 of the array-type semiconductor laser chip 502.

In the structure of the present example, the mounting accuracy in a y-direction (i.e., the positioning adjustment (alignment) accuracy) is improved by controlling thicknesses of the Au layer 513 and the solder (Au/Sn) layer 514 with high accuracy, and by controlling the pressure applied to the array-type semiconductor laser chip 502 and the temperature at the time of melting the solder in a highly accurate manner.

Next, a mounting method for the structure of the present example will be described.

First, the array type semiconductor laser chip 502 is mounted on the submount 501 in a junction-down manner so that the active layer-side surface thereof is disposed closer to the submount 501. Next, in order to melt the solder (Au/Sn) layers 514, the submount 501 is pulse-heated. Since the temperature of the submount 501 is raised to about 300° C. during the heating step, there exists a possibility that the operating characteristics of the wavelength converting device 504 vary in the case where the heating step for fixing the array type semiconductor laser chip 502 is conducted after the optical waveguide type wavelength converting device 504 is fixed. Therefore, it is preferable that the array type semiconductor laser chip 502 is heated so as to be fixed prior to the fixation of the optical waveguide type wavelength converting device 504.

Thereafter, in the same manner as that in Example 8, the images of the array type semiconductor laser chip 502 and the submount 501 are recognized by individual cameras. A precision stage is moved so that a center line AS between the cross-shaped keys 515 coincides with a center line B5 between the cross-shaped keys 516. Subsequently, the fixation step is performed by heating the submount 501.

After mounting the array type semiconductor laser chip 502, in the same manner as that in Example 9, the optical waveguide type wavelength converting device 504 is moved so that the center line of the cross-shaped keys 510 on the optical waveguide type wavelength converting device 504 and the center line of the cross-shaped keys 511 on the submount 501 coincide with each other, and a distance between the outputting surface of the array type semiconductor laser chip 502 and the inputting surface of the optical waveguide type wavelength converting device 504 is about 3 μm. Thereafter, the optical waveguide type wavelength converting device 504 is irradiated with UV light so as to be fixed while being applied with a constant amount of pressure.

According to the structure of the present example, the intervals between the light-emitting regions 503 of the array type semiconductor laser chip 502 are identical with the intervals between the optical waveguides 505 of the optical waveguide type wavelength converting device 504. As a result, it is possible to realize a coupling efficiency of about 60% or more for all of the ten optical waveguides 505. By changing the current injected into the DBR region of the array type semiconductor laser chip 502 so as to vary an oscillation wavelength such that the oscillation wavelength of the semiconductor laser 502 coincides with the phase matching wavelength of the optical waveguide type wavelength converting device 504, a blue output of about 10 mW can be obtained from each of the waveguides 505.

As described above, by setting the intervals between the light-emitting regions of the array type semiconductor laser chip 502 having a plurality of light-emitting regions to be equal to the intervals between optical waveguides of the wavelength converting device 504 having a plurality of optical waveguides 505, the coupling adjustment can be simultaneously performed for the plurality of the waveguides. As a result, an array type short-wavelength light source can be easily realized.

Although the optical waveguide type wavelength converting device 504 fabricated on the MgO-doped LiNbO$_3$ substrate is used in the present example described above, the same effects can be obtained by using an optical waveguide type wavelength converting device fabricated on a LiTaO$_3$ substrate or KTiOPO$_4$ substrate.

Instead of performing the positioning adjustment (alignment) while observing a distance between the array type semiconductor laser chip 502 and the optical waveguide type wavelength converting device 504 as described above, a gap with a predetermined size can be maintained with high accuracy between the semiconductor laser 502 and the wavelength converting device 504 by forming a Ta film 517 with a thickness of about 1 μm at the end surface of the optical waveguide type wavelength converting device 504. Consequently, the positioning adjustment in a z-direction can be easily realized, thereby obtaining a more practical device structure. Instead of the Ta film 517, a variety of metal films or dielectric films can be suitably provided.

Figure 22:
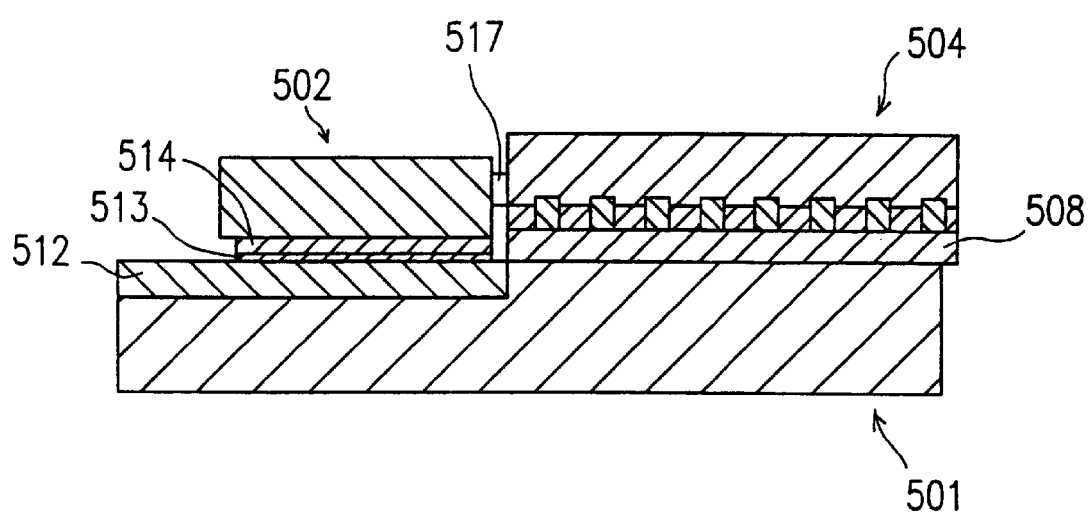
FIG. 22 is a cross-sectional view schematically showing another structure of the optical integrated device according to Example 12 of the present invention.

In the structure of FIG. 22, the same components as those in FIG. 20 or 21 are denoted by the same reference numerals, the description thereof is herein omitted.

EXAMPLE 13

In the previous Example 12, the images of the cross-shaped keys formed on the submount, the array type semiconductor laser chip, and the optical waveguide type wavelength converting device, respectively, are recognized. The mounting step is performed by such a passive positioning adjustment, thereby realizing a short-wavelength light source. According to the present example, on the other hand, an active adjustment method, in which the array type semiconductor laser chip is driven to emit light, and the resultant laser beam is actually coupled with the optical waveguide, will be described with reference to the schematic perspective view of FIG. 23 and the schematic plan view of FIG. 24.

Figure 23:
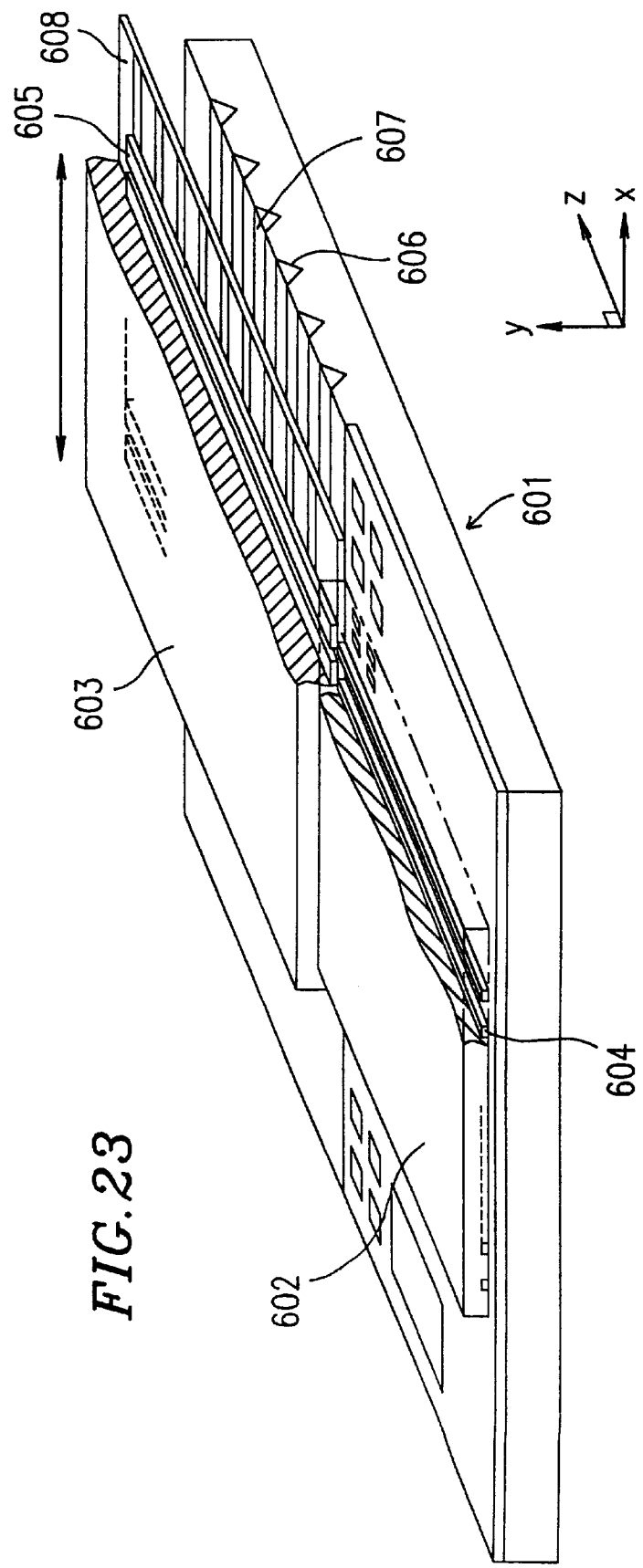
FIG. 23 is a perspective view for describing a method for performing positioning (alignment) adjustment of an optical integrated device according to Example 13 of the present invention.

In FIG. 23, an array type semiconductor laser chip 602 is mounted on a silicon (Si) submount 601 in a similar junction-down manner with that in Example 12. As the array type semiconductor laser chip 602, for example, a 100 mW class array-type DBR AlGaAs semiconductor laser chip having fifty light-emitting regions 604 is used. A width of the semiconductor laser chip 602 is typically about 20 mm, and a pitch between two adjacent light-emitting regions is typically about 400 μm.

On the other hand, as a planar type optical waveguide element 603, an optical waveguide type wavelength converting device 603 in which proton exchange optical waveguides 605 and periodic domain-inverted regions are provided on an x-cut MgO-doped LiNbO$_3$ substrate is used. A pitch between the adjcent optical waveguides 605 of the optical waveguide type wavelength converting device 603 is also set to be about 400 μm, and about fifty optical waveguides 605 are included in the optical waveguide type wavelength converting device 603.

As the array type semiconductor laser chip 602, a chip oscillating in a TE mode is employed. Since the optical waveguide fabricated on the x-cut substrate is capable of waveguiding TE mode light only, the planar type direct coupling can be realized.

In the same manner as that in Example 12, the optical waveguide type wavelength converting device 603 is mounted on the submount 601 with grooves 606. UV curable type adhesive 607 is injected into the grooves 606 as an adhesive. On the other hand, a protecting film 608 for adjusting a thickness is formed on the surface of the optical wavelength type wavelength converting device 603. A Ta film 609 for adjusting a gap with a thickness of about 1 μm is formed at the end surface of the optical wavelength type wavelength converting device 603 (see FIG. 24). Since the protecting film 608 and the Ta film 609 are provided on the surface of the optical waveguide type wavelength converting device 603 as described above, it is possible to easily perform positioning adjustment (alignment) in a y-direction and a z-direction as in Example 12.

Figure 24:
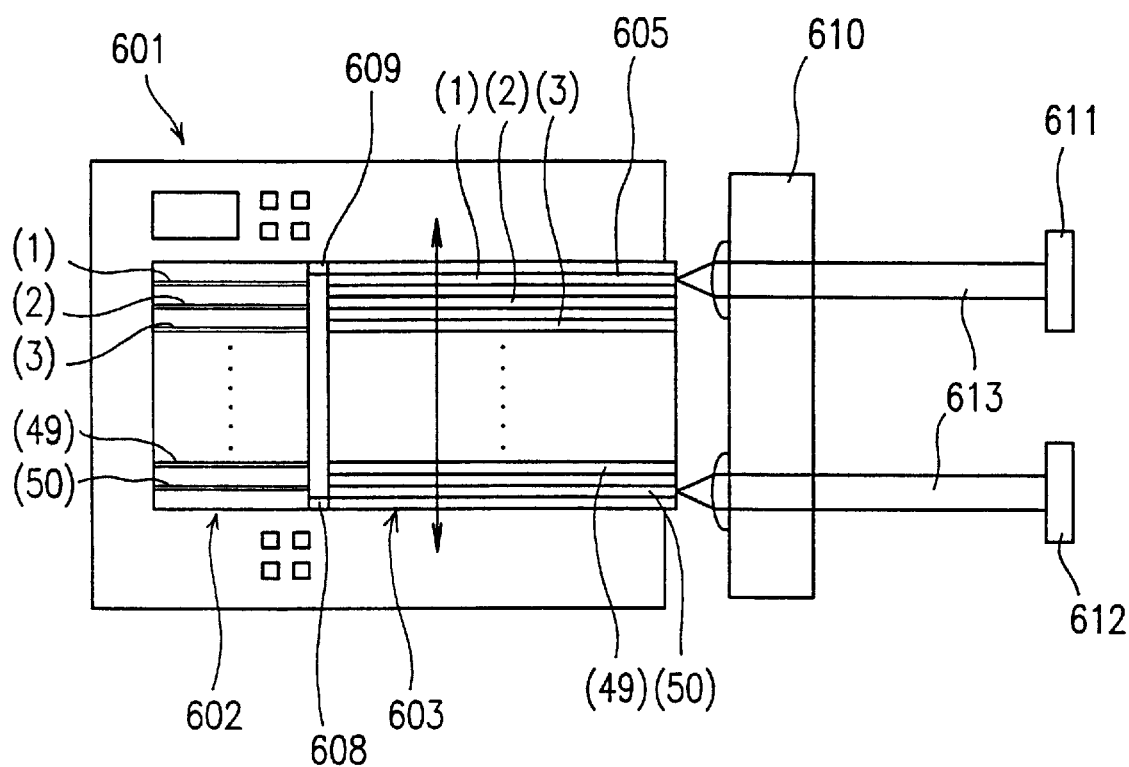
FIG. 24 a plan view for describing the method for performing positioning (alignment) adjustment of the optical integrated device according to Example 13 of the present invention.

Next, a positioning adjustment (alignment) method in an x-direction for the structure of the present example will be described with reference to FIG. 24.

The present example differs from Example 12 in that cross-shaped keys for adjustment are not provided on the optical waveguide type wavelength converting device 603. Instead of the cross-shaped keys, a lens barrel 610 having two fixed aspherical lenses each having a numerical aperture of 0.5 is used for collimating laser beams output from both sides of the optical waveguide type wavelength converting device 603. Specifically, a current is injected into each of the first and the fiftieth active layer regions of the semiconductor laser chip 602 (respectively indicated as "(1) " and "(50)" in the figure) so as to generate laser oscillation. At that time, laser beams 603 output from the corresponding first and fiftieth optical waveguides 605 of the optical waveguide type wavelength converting device 603 are collimated by the lens barrel 610, and the outputs thereof are detected by photodetectors 611 and 612, respectively. The position of the optical waveguide type wavelength converting device 605 is then adjusted in an x-direction, and the optical waveguide type wavelength converting device 603 is fixed by curing the adhesive by UV radiation at a position where the sum of the outputs detected by the photodetectors 611 and 612 becomes maximum.

According to the alignment method as described above, coupling efficiencies for the two optical waveguides are typically about 70%, respectively. Moreover, by performing the positioning adjustment for the optical waveguide type wavelength converting device 603 so that the coupling efficiencies become maximum in the two optical waveguides 605 positioned at both ends of the optical waveguide type wavelength converting device 603, a coupling efficiency of about 65% or more can be obtained for each of the fifty waveguides 605.

As described above, when a pitch between the two adjacent light-emitting regions of the array type semiconductor laser chip 602 having a plurality of light-emitting regions is set to be equal to a pitch between the two adjacent optical waveguides of the wavelength converting device 603 having a plurality of optical waveguides 605, performing the coupling adjustment for only a small number of the optical waveguides performs the coupling adjustment for the rest of the large number of the optical waveguides. As a result, an array type short-wavelength light source can be easily realized.

In the aforementioned present example, the positioning adjustment (alignment) is performed using the light-emitting regions and the optical waveguides positioned at both ends of the array type semiconductor laser chip and the wavelength converting device, respectively. However, the same effects can be obtained by using the light-emitting regions and the optical waveguides positioned in the central regions thereof. Moreover, in the present example described above, the positioning adjustment is performed so that the sum of the coupling efficiencies at the two optical waveguides becomes maximum. However, when a fabrication accuracy for the interval between the two adjacent light-emitting regions and that for the interval between the two adjacent optical waveguides are high, the same effects can be obtained by allowing only one of the light-emitting regions to generate laser oscillation, and by performing the positioning adjustment with the detection of only light coupled with the corresponding optical waveguide.

Three or more regions may be allowed to emit light for the positioning adjustment. However, if the number of such regions is too many, such a method becomes substantially the same as the active adjustment method. As a result, a plurality of power sources for laser oscillation are required, thereby complicating the adjustment step. Therefore, the practical effect thereof is reduced.

By performing the coupling adjustment actually by generating laser oscillation as in the present example, more accurate device fixation can be realized. In the case where the optical adjustment is performed actually by generating laser oscillation, there is a possibility that the semiconductor laser chip may be deteriorated. However, by oscillating only two of the fifty light-emitting regions as in the present example, there is no possibility that the rest of the light-emitting regions are deteriorated, thereby realizing the optical adjustment similar to the passive adjustment.

EXAMPLE 14

In Example 14 of the present invention, a method for producing a short-wavelength light source having a high productivity, in which the methods for producing the array type short-wavelength light source described in Examples 12 and 13 are combined with a step of cutting the array type light source into a pair of a semiconductor chip and an optical waveguide, will be described.

In general, there are two steps for producing an array type short-wavelength light source. Specifically, the first step is a step for fixing the array type semiconductor laser chip on a submount by solder. The second step is a step for fixing a planar type optical waveguide element by UV curable type adhesive.

The first step further includes a step for attaching the semiconductor laser chip to a tool and fixing the submount to a table; a step for recognizing the images of cross-shaped keys on the semiconductor laser chip and the submount by cameras so as to perform the positional adjustment to a desired position; and a step for heating the submount so as to melt the solder, thereby fixing the semiconductor laser chip. Time required to perform the image recognition and the positional adjustment is about 120 seconds, and time necessary for melting the solder so as to fixing the semiconductor laser is about 30 seconds.

The second step includes a step for attaching an optical waveguide type wavelength converting device to tool; a step for injecting UV curable type adhesive onto the submount; a step for recognizing the images of cross-shaped keys on the optical waveguide type wavelength converting device and the submount by cameras so as to perform the positional adjustment to a desired position; and a step for fixing the optical waveguide type wavelength converting device by UV radiation. Time required to complete the second step is about 120 seconds.

Accordingly, the total time required to produce the short-wavelength light source is about 270 seconds per a light source. Therefore, if an optical integrated device is fabricated by fixing one semiconductor laser chip and one optical waveguide type wavelength converting device are fixed onto the submount, about 270 seconds are necessary as the fabrication time for such an optical integrated device. Thus, cost for performing the positional adjustment and fixation processes becomes greater than the material cost. In order to widely use the optical integrated device, it is necessary for the optical integrated device to have a high productivity and a low cost. With the aforementioned production method, however, such a demand cannot be satisfied.

According to the array type short-wavelength light source as in Example 12 or 13, time required for the positional adjustment and fixation is substantially the same as the aforementioned value. Therefore, when the array type short-wavelength light source as in Example 12 or 13 is first formed, and then the array type short-wavelength light source is cut into a pair as the third step, time required for the positional adjustment and fixation per a pair is significantly reduced.

For the cutting process, a dicing saw or a laser processing machine may be used, and time required for the cutting by such means is about 100 seconds.

From a practical standpoint, the laser processing machine causes less damage of the semiconductor laser chip or the optical waveguide type wavelength converting device as compared to the dicing saw. Therefore, the laser processing machine is more preferable in terms of processability. Specifically, as a light source for the laser processing machine, (1) a YAG laser, (2) an excimer laser, and (3) a UV laser utilizing harmonic waves of an oscillation light of a solid-state laser may be used. Each of these light sources has characteristics as described below.

(1) YAG laser: since the YAG laser performs thermal processing, damage on the optical waveguide type wavelength converting device is significant.

(2) Excimer laser: since light collecting characteristics is poor, a mask is required. However, due to the fact that light emitted from the excimer laser is included in UV region, and due to the additional effect by chemical reaction, it is possible to realize the cutting process with less heat generated, thereby causing less damage.

(3) UV laser as harmonic waves of the solid-state laser: the optical collecting characteristics thereof is high, the effect by chemical reaction is significant, and damage on the device is small.

When cutting is performed by the dicing saw or the laser processing device, it is necessary to secure a region in the range of about 50 $\mu$m to about 100 $\mu$m as a cutting margin. By taking this point into consideration, it is preferable that each of intervals between the two adjacent light-emitting regions of the array type semiconductor laser and intervals between the two adjacent optical waveguides of the optical waveguide type wavelength converting device are set in the range of about 0.3 mm to about 1.0 mm. If the value of each of such intervals exceeds about 1.0 mm, the number of devices obtained from one substrate is reduced. If the value of each of such intervals becomes smaller than about 0.3 mm, a sufficient amount of cutting margin cannot be secured.

By performing the aforementioned series of three steps, a short-wavelength micro-size light source can be produced. In this case, time required to produce one short-wavelength light source is about 8 seconds (=370 seconds/50), and consequently, 450 pieces of the short-wavelength micro-size light sources can be fabricated per hour with using a single fabricating apparatus. Therefore, highly productive device fabrication can be realized.

In the case where strength regarding fixation between the semiconductor laser chip or the optical waveguide type wavelength converting device and a submount is weak, if cutting is performed by using the dicing saw, the device could be come off from the submount. Therefore, after applying a material such as resist or wax which is removable by organic solvent to the light coupling region in the array type short-wavelength micro-light source, the semiconductor laser chip and the optical waveguide type wavelength converting device are fixed. Thereafter, the cutting step is performed, and the applied material is removed by organic solvent after the cutting. In this manner, cutting causing less damage becomes possible.

In the optical integrated device, it is essential to mount a semiconductor laser chip, an optical fiber, an optical waveguide type device, and the like, on a submount and to couple a laser beam from the semiconductor laser with the optical fiber or the optical waveguide device at a high efficiency. In particular, the optical waveguide fabricated on a dielectric substrate or a ferroelectric substrate by using an ion exchange method such as proton exchange, a diffusion method such as Ti diffusion, or the like, generally has a depth of about 2 $\mu$m. Such an optical waveguide requires more accurate positioning adjustment (alignment), for example, in the order of a submicron as compared to the optical integrated device using the optical fiber. Therefore, it is important to form a groove on the submount as described above, and thus enhance the positioning adjustment (alignment) accuracy in a thickness direction of a substrate. When the present invention is applied to the short-wavelength blue light source structured by the DBR semiconductor laser and the optical waveguide type wavelength converting device such that periodic domain-inverted regions are provided on a $LiNbO_3$ substrate or a $LiTaO_3$ substrate, the practical effect of the present invention is especially significant.

In the case where the semiconductor laser chip or the optical waveguide device is mounted on a submount using a fixing member such as solder or adhesive, it is important to control the thickness of the solder or the adhesive. However, in an actual situation, it is difficult to perform positioning adjustment in the order of a submicron in a thickness direction (i.e., y-direction) by accurately controlling the thickness of the solder or the adhesive. On the other hand, by forming a groove on the submount as in the present invention, and injecting solder or adhesive inside the groove, the degree of contact between the semiconductor laser chip or the optical waveguide device and the submount is improved. As a result, highly accurate mounting can be realized, and the practical effect thereof is significant.

In order to further spread the commercial use of the optical integrated device, it is necessary to further reduce the cost of the direct coupling type module. In order to realize such a reduced cost, highly productive and highly accurate modularizing technique is required. As in the present invention, a large number of light coupling operations can be easily realized while maintaining high accuracy by using the array type semiconductor laser having a large number of light-emitting portions and the optical waveguide device having a plurality of optical waveguides, and by setting intervals between the two adjacent light-emitting portions to be equal to intervals between the two adjacent optical waveguides. Moreover, by cutting the array structure into individual structures each of which includes a pair of one semiconductor laser and one optical waveguide, highly productive device production can be realized.

As described above, according to the present invention, in the optical integrated device having a structure such that the semiconductor laser and the optical waveguide element are mounted on the submount, a mounting accuracy in a thickness direction of the substrate (i.e., y-direction) is improved, thereby being capable of coupling a laser beam output from the semiconductor laser chip with the optical waveguide of the optical waveguide element at a high efficiency.

Moreover, according to the present invention, when the semiconductor laser chip having the active layer region for providing gain and the distributed Bragg reflection (DBR) region for controlling an oscillation wavelength is fixed onto the submount in a junction-down manner, stable wavelength variable characteristics and oscillation characteristics can be realized by providing a groove for electrically isolating the portion corresponding to the active layer region and the portion corresponding to the DBR region.

Furthermore, according to the present invention, a large number of light coupling operations between the light-emitting regions and the optical waveguides can be realized when the integrated optical device is formed by mounting the array type semiconductor laser chip having a plurality of the light-emitting regions (two or more light-emitting regions) and the planar type optical waveguide device having a plurality of optical waveguides (two or more optical waveguides) on the submount.

In addition, according to the present invention, optical integrated devices can be provided with a high productivity.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of producing an optical integrated device, comprising:

a first mounting step of mounting an array type semiconductor laser chip including two or more light emitting portions onto a submount;

a second mounting step of mounting a planar type optical waveguide element including two or more optical waveguides, a pitch between the optical waveguides being equal to a pitch between the light emitting portions, at a prescribed position on the submount; and a cutting step of cutting the submount into separate pieces, wherein each of the pieces includes at least one pair of the light emitting portion of the array type semiconductor laser chip and the optical waveguide of the planar type optical waveguide element.

2. A method according to claim 1, wherein the second mounting step includes the steps of:

emitting a laser light from at least one of the light emitting portions of the array type semiconductor laser chip;

coupling the emitted laser light to the corresponding optical waveguide of the planar type optical waveguide element;

adjusting a position of the planar type optical waveguide element on the submount so that an optical coupling efficiency with the coupled optical waveguide reaches the maximum level; and fixing the planar type optical waveguide element at the adjusted position on the submount.

3. A method according to claim 1, wherein the array type semiconductor laser chip is mounted onto the submount so that a surface of an active layer side thereof faces the submount.

4. A method according to claim 1, wherein the planar type optical waveguide element is a wavelength converting device which converts a laser light emitted from the array type semiconductor laser chip into a light having a wavelength equal to half of that of the emitted laser light.

5. A method according to claim 1, wherein the array type semiconductor laser chip is a distributed Bragg reflection type semiconductor laser chip having an active layer region and a distributed Bragg reflection region.

6. A method according to claim 1, wherein the array type semiconductor laser chip oscillates in a TE mode polarization and an optical waveguide of the planar type optical waveguide element allows a TE mode light to propagate therein.

7. A method according to claim 1, wherein the planar type optical waveguide element includes an optical waveguide formed on a surface of a dielectric substrate or a ferroelectric substrate.

8. A method according to claim 1, wherein the pitch between the light emitting portions of the array type semiconductor laser chip and the pitch of the optical waveguides of the planar type optical waveguide element are respectively set in a range from about 0.3 mm to about 1.0 mm.

9. A method according to claim 1, wherein an alignment mark is provided respectively on the array type semiconductor laser chip and the planar type optical waveguide element for aligning the light emitting portion and the optical waveguide.

10. A method according to claim 1, wherein a metal film or a dielectric film is formed between the array type semiconductor laser chip and the planar type optical waveguide element for forming a prescribed gap therebetween.

* * * * *